US012709158B2

(12) United States Patent
Jeon et al.

(10) Patent No.: US 12,709,158 B2
(45) Date of Patent: Aug. 18, 2026

(54) DISPLAY DEVICE FOR VEHICLE COMPRISING SLIDING ASSEMBLY

(71) Applicant: LG ELECTRONICS INC., Seoul (KR)

(72) Inventors: Byunglok Jeon, Seoul (KR); Hansoo Kim, Seoul (KR); Inkoo Shim, Seoul (KR); Romain Diboine, Seoul (KR); Byungkyu Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 162 days.

(21) Appl. No.: 18/845,526

(22) PCT Filed: Mar. 11, 2022

(86) PCT No.: PCT/KR2022/003416

§ 371 (c)(1),
(2) Date: Sep. 10, 2024

(87) PCT Pub. No.: WO2023/171838

PCT Pub. Date: Sep. 14, 2023

(65) Prior Publication Data

US 2026/0173280 A1 Jun. 18, 2026

(51) Int. Cl.

*H05K 5/02* (2006.01)
*B60K 35/22* (2024.01)
*B60K 35/53* (2024.01)

(52) U.S. Cl.

CPC ........... *H05K 5/0217* (2013.01); *B60K 35/22* (2024.01); *B60K 35/53* (2024.01)

(58) Field of Classification Search

CPC ...... H05K 5/0217; B60K 35/22; B60K 35/53; B60R 11/0235

See application file for complete search history.

(56) References Cited

U.S. PATENT DOCUMENTS 6,012,785 A * 1/2000 Kawasaki .............. B60K 35/22 312/29
6,557,958 B1 * 5/2003 Motta ..................... E05D 15/42 312/319.2

(Continued)

FOREIGN PATENT DOCUMENTS

CN 113085742 A 7/2021
CN 113276783 A 8/2021

(Continued)

*Primary Examiner* — Abhishek M Rathod
(74) *Attorney, Agent, or Firm* — Birch, Stewart, Kolasch & Birch, LLP

(57) ABSTRACT

Disclosed is a display device for a vehicle. The display device for the vehicle according to the present disclosure may include: a housing with an open side; a sliding assembly located in the housing and including a slider which is movable away from or toward the opening; a body located in the housing and fixed on the slider; and a display coupled to the body, and which is movable out of the housing through the opening, wherein the display may include: a display panel; and a swing module which is located between the display panel and body, to which the display panel is coupled, and which is rotatably coupled to the body, and wherein a rotational shaft of the swing module may intersect a movement direction of the body.

15 Claims, 30 Drawing Sheets

(56) References Cited

U.S. PATENT DOCUMENTS 6,636,426 B2 * 10/2003 Inman ..................... G06F 1/187
361/825
7,969,714 B2 * 6/2011 Wang .................. B60R 11/0235
361/679.04
8,002,179 B2 * 8/2011 Feit ........................ B60K 35/10
235/382
2003/0142063 A1 * 7/2003 Wang .................. B60R 11/0235
345/156
2005/0174724 A1 * 8/2005 Chen ................... B60R 11/0235
361/679.02
2021/0206265 A1 * 7/2021 Song ...................... B60K 35/10
2022/0144085 A1 * 5/2022 Lian .................... B60R 11/0235

FOREIGN PATENT DOCUMENTS

DE 10 2014 105 785 A1 11/2014
DE 10 2017 214 737 A1 2/2019
DE 10 2017 214 737 B4 4/2020
EP 3 943 798 A1 1/2022
JP 5-105002 A 4/1993
JP 2005-335592 A 12/2005
JP 2012-113213 A 6/2012
WO WO 2015/057851 A1 4/2015

* cited by examiner

【FIG. 1】
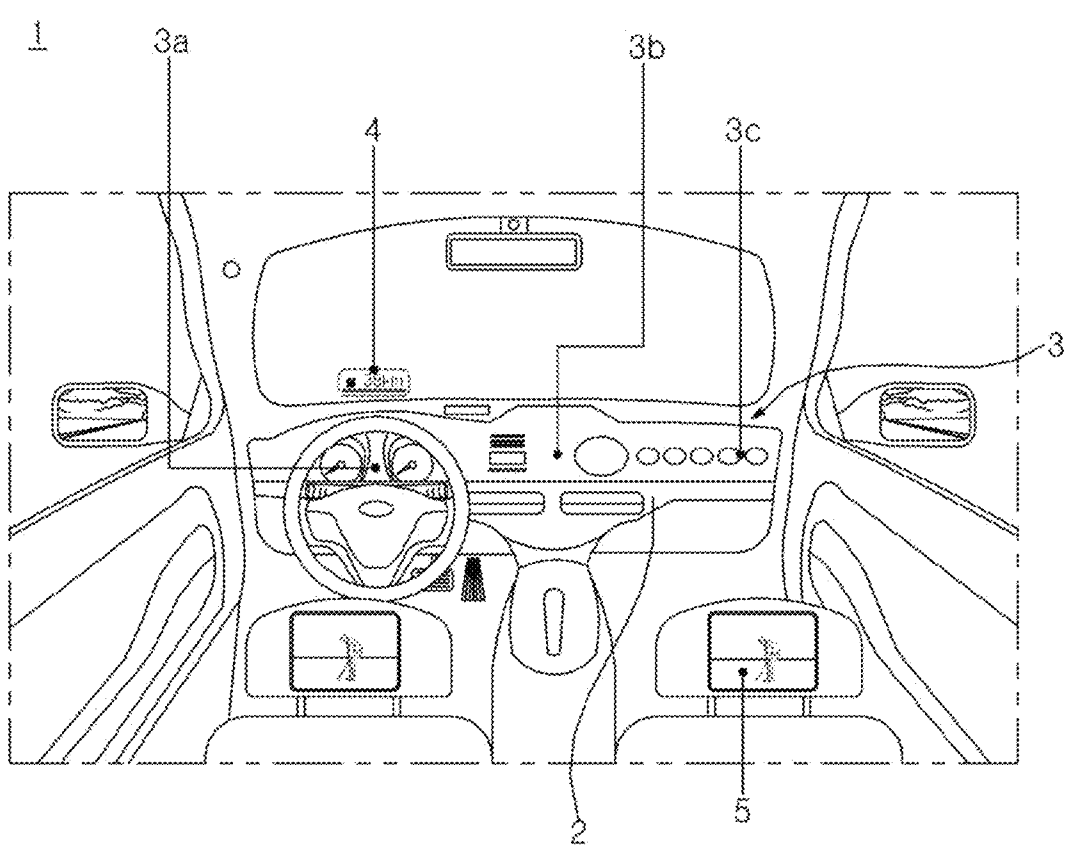

【FIG. 2】
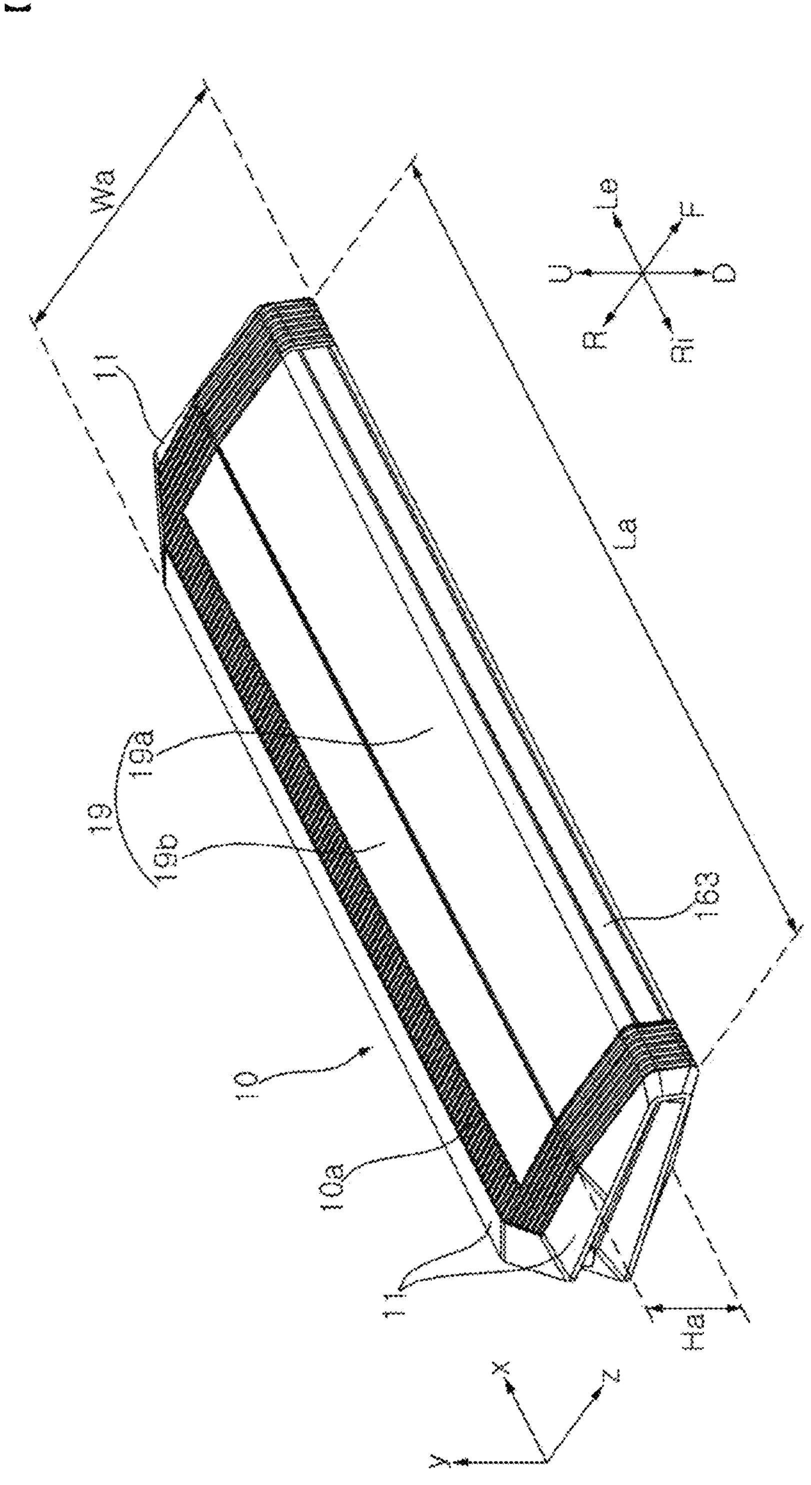

【FIG. 3】
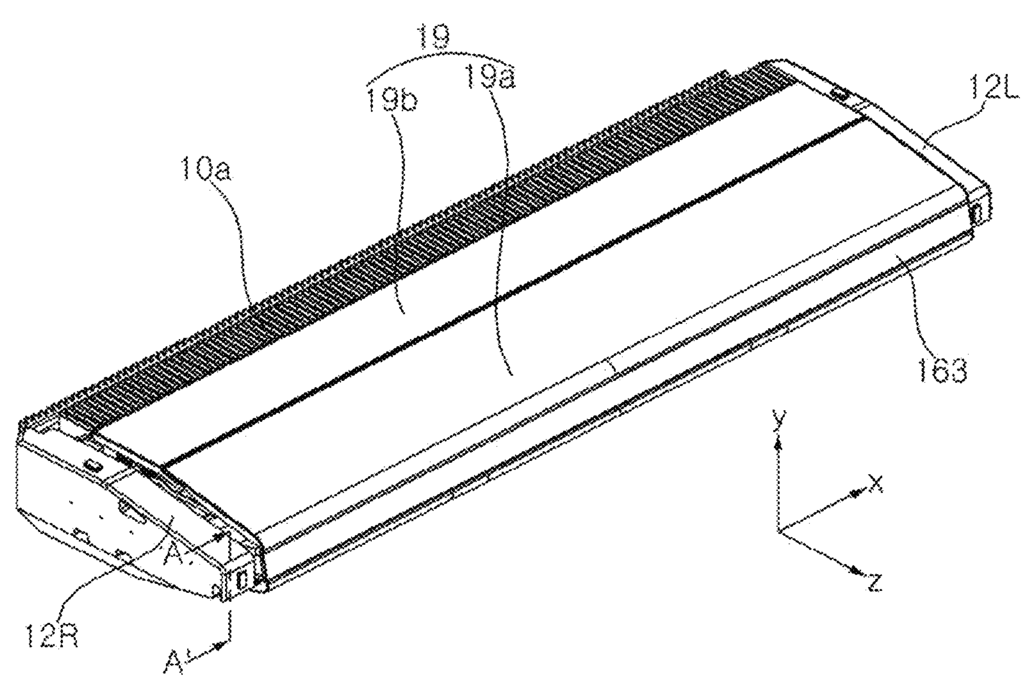

【FIG. 4】
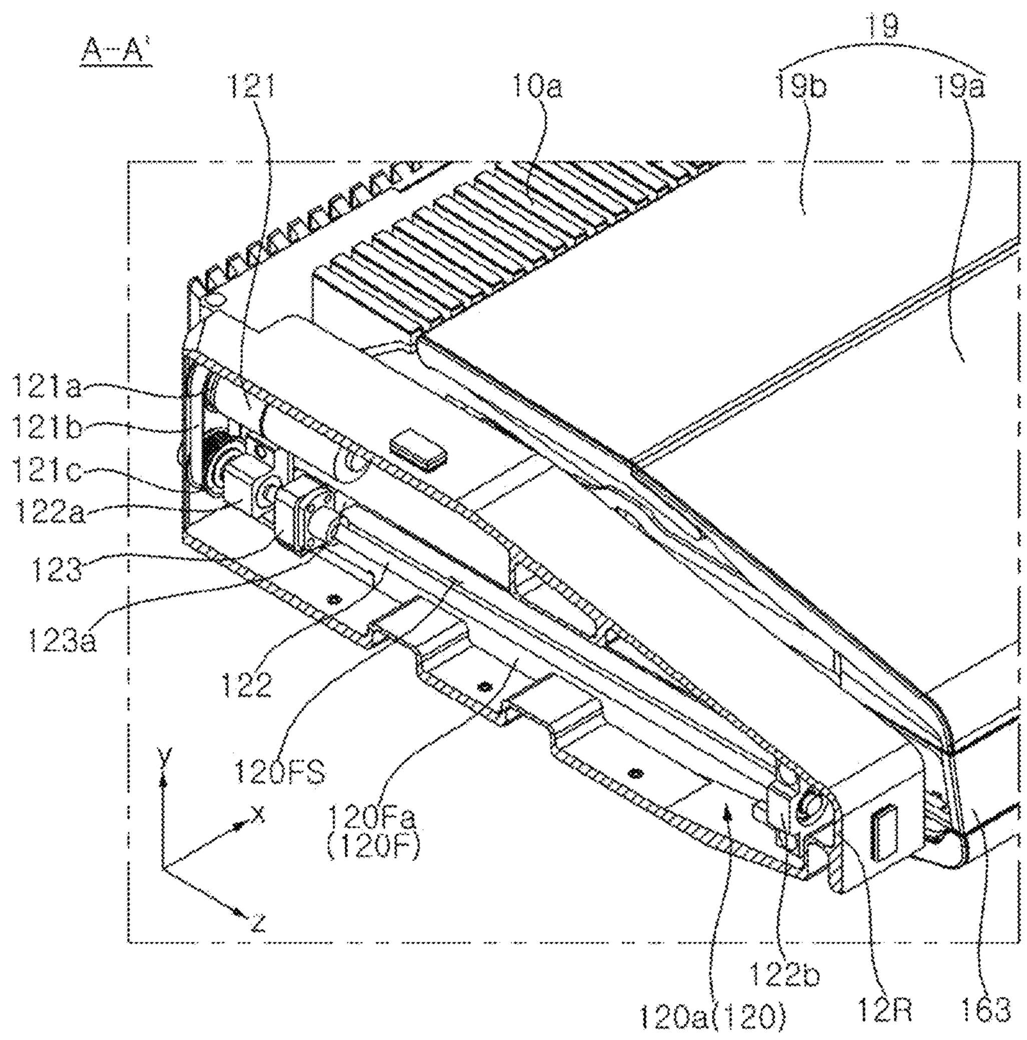

【FIG. 5】
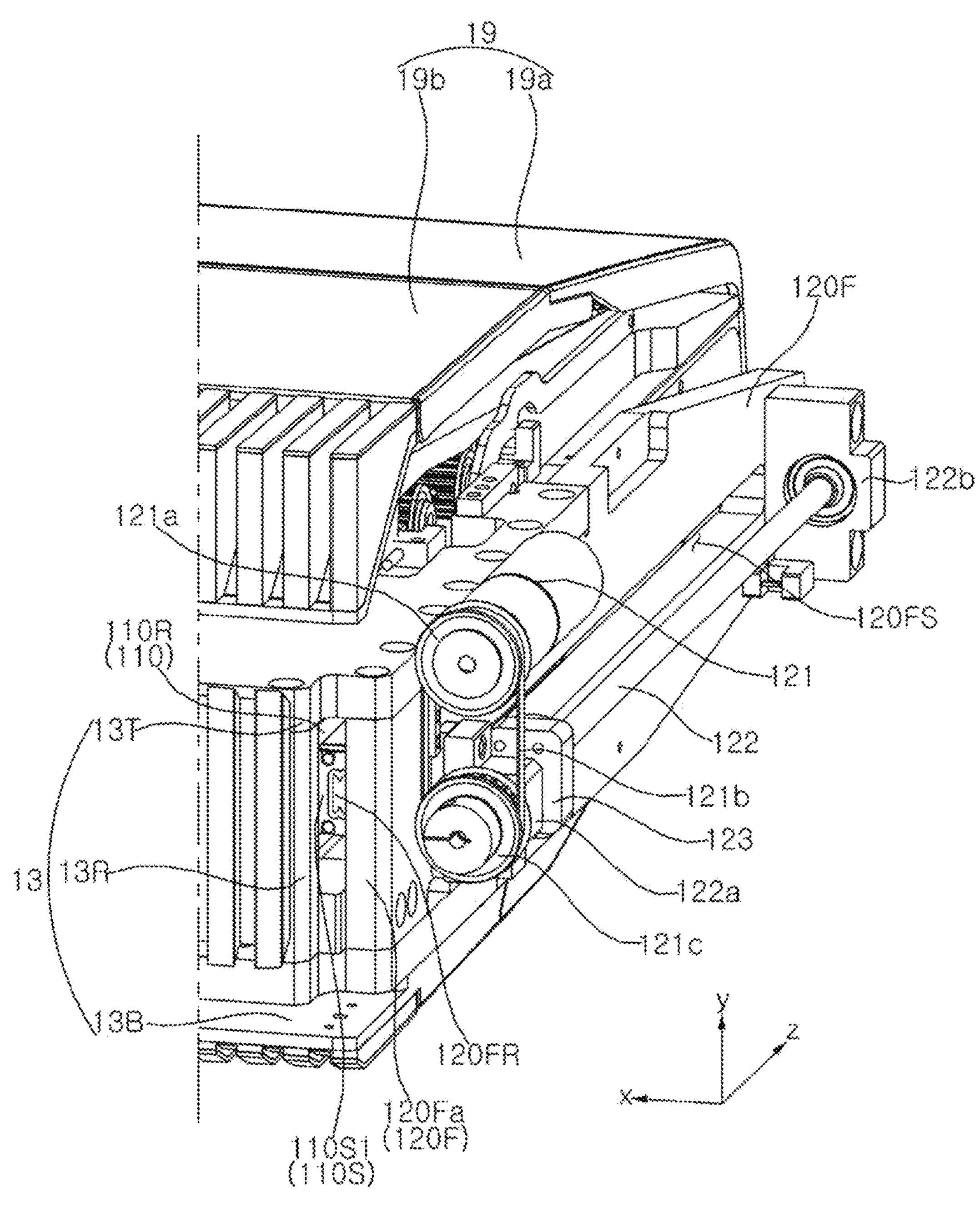

【FIG. 6】
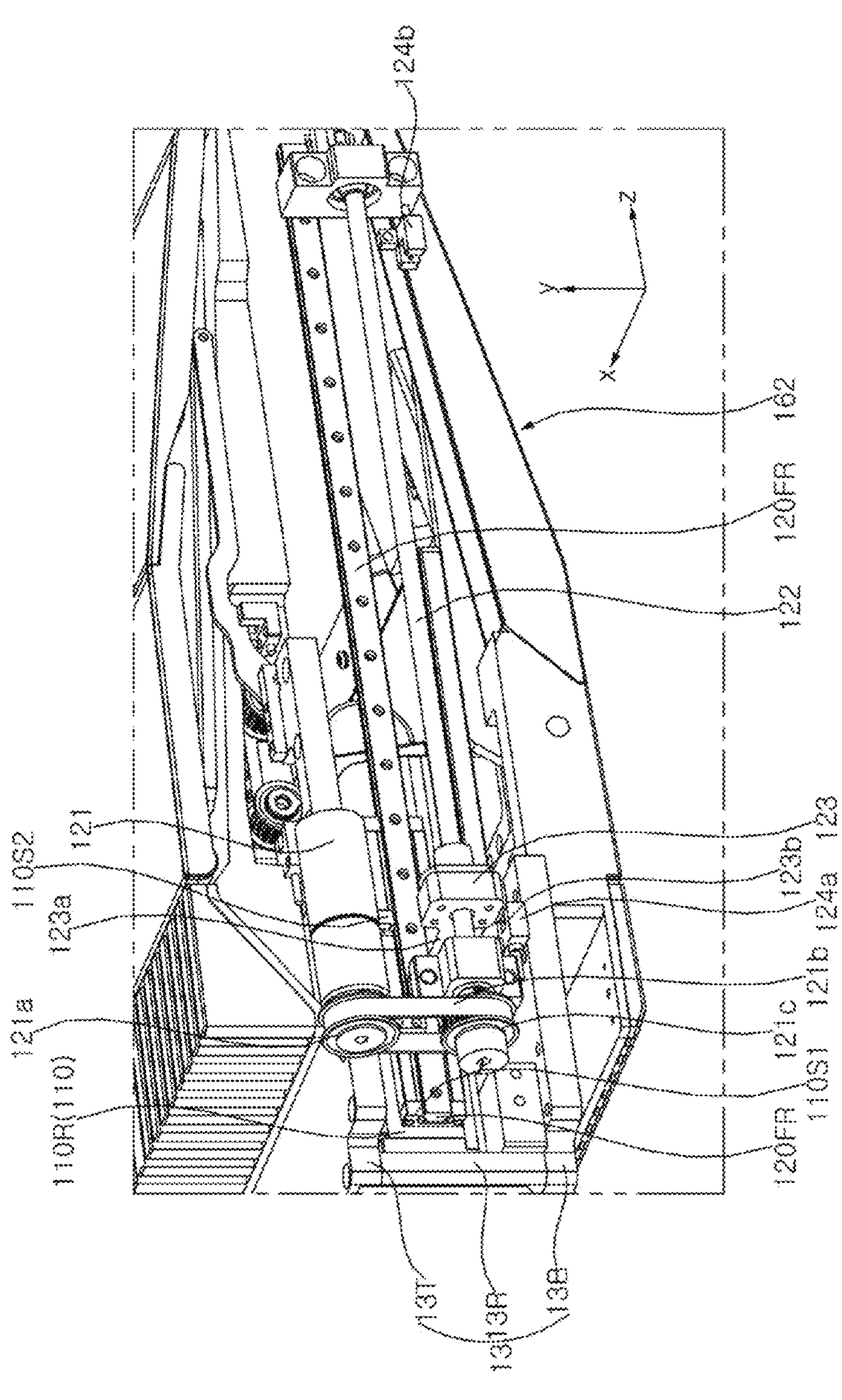

【FIG. 7】
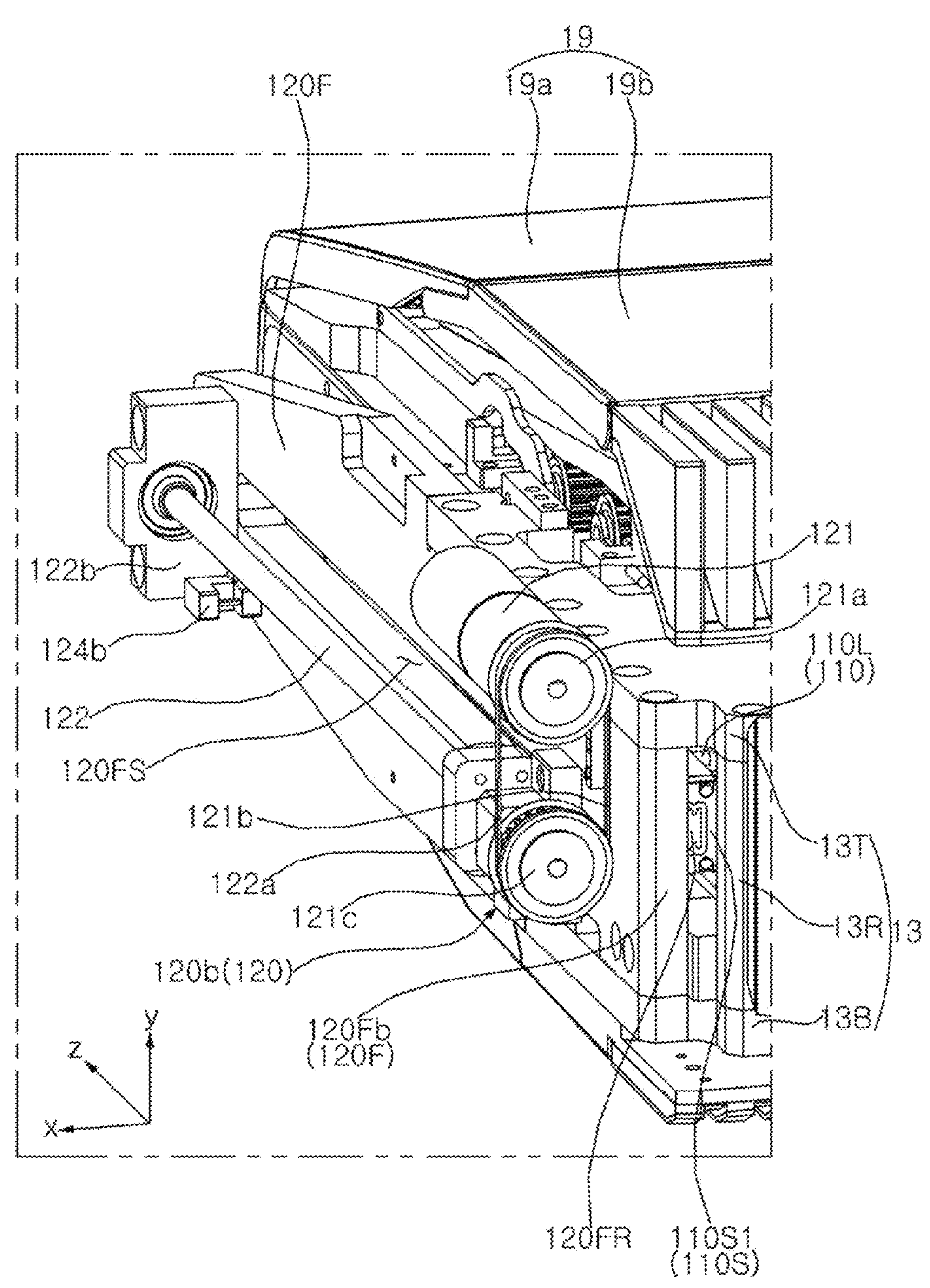

【FIG. 8】
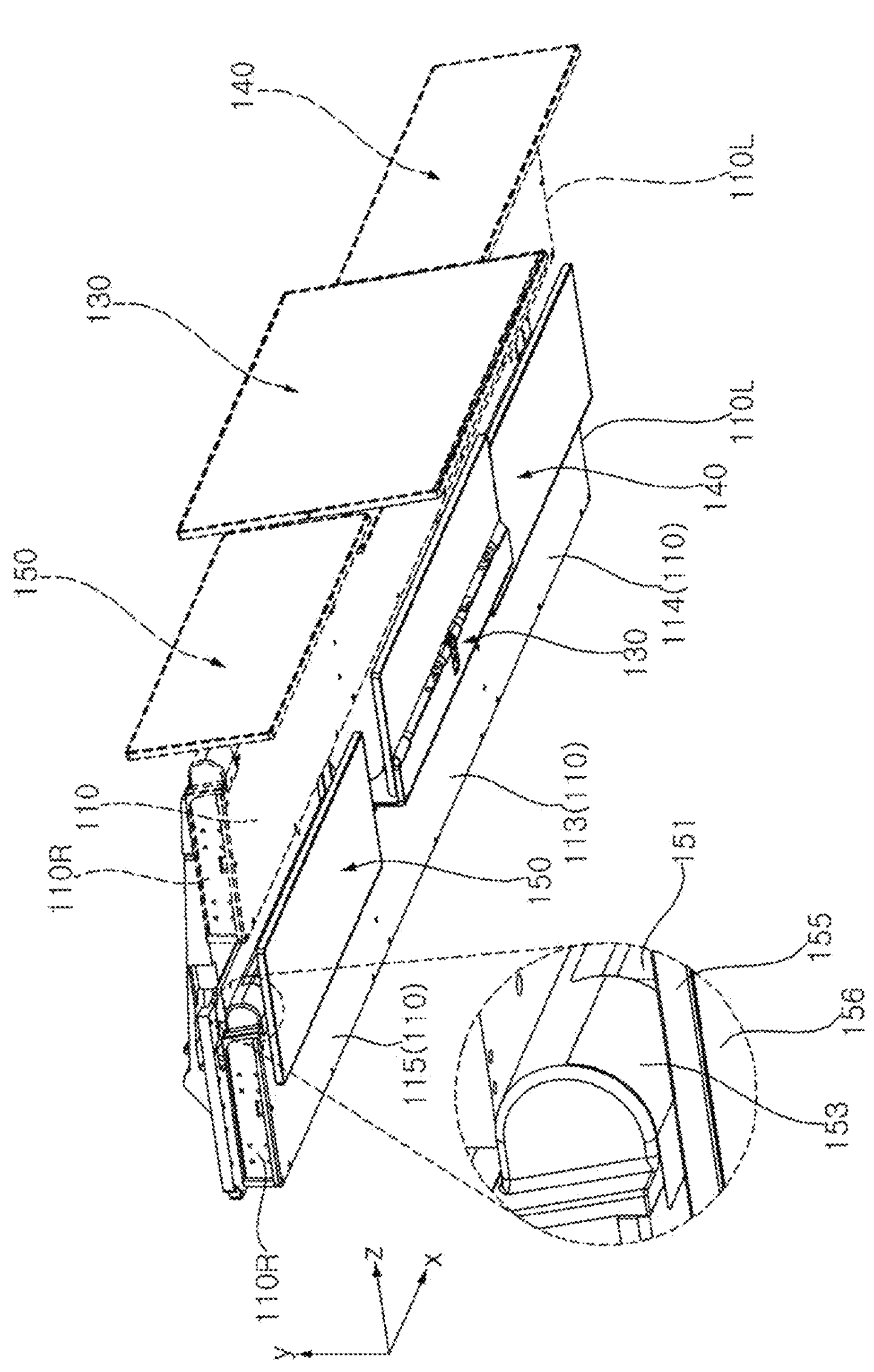

【FIG. 9】
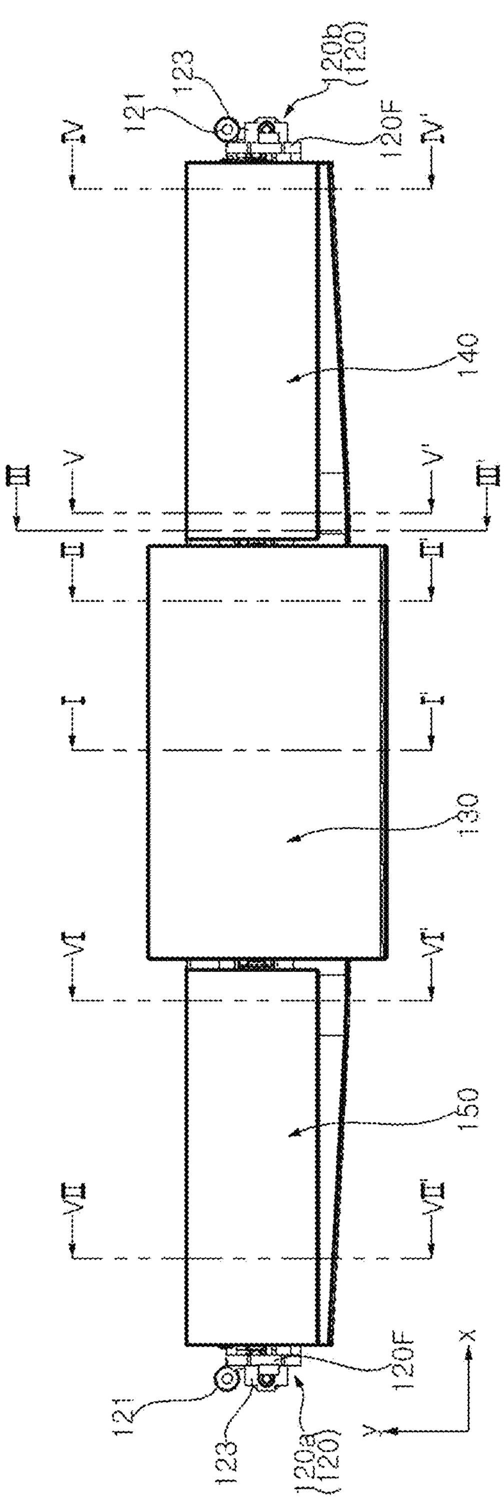

【FIG. 10】
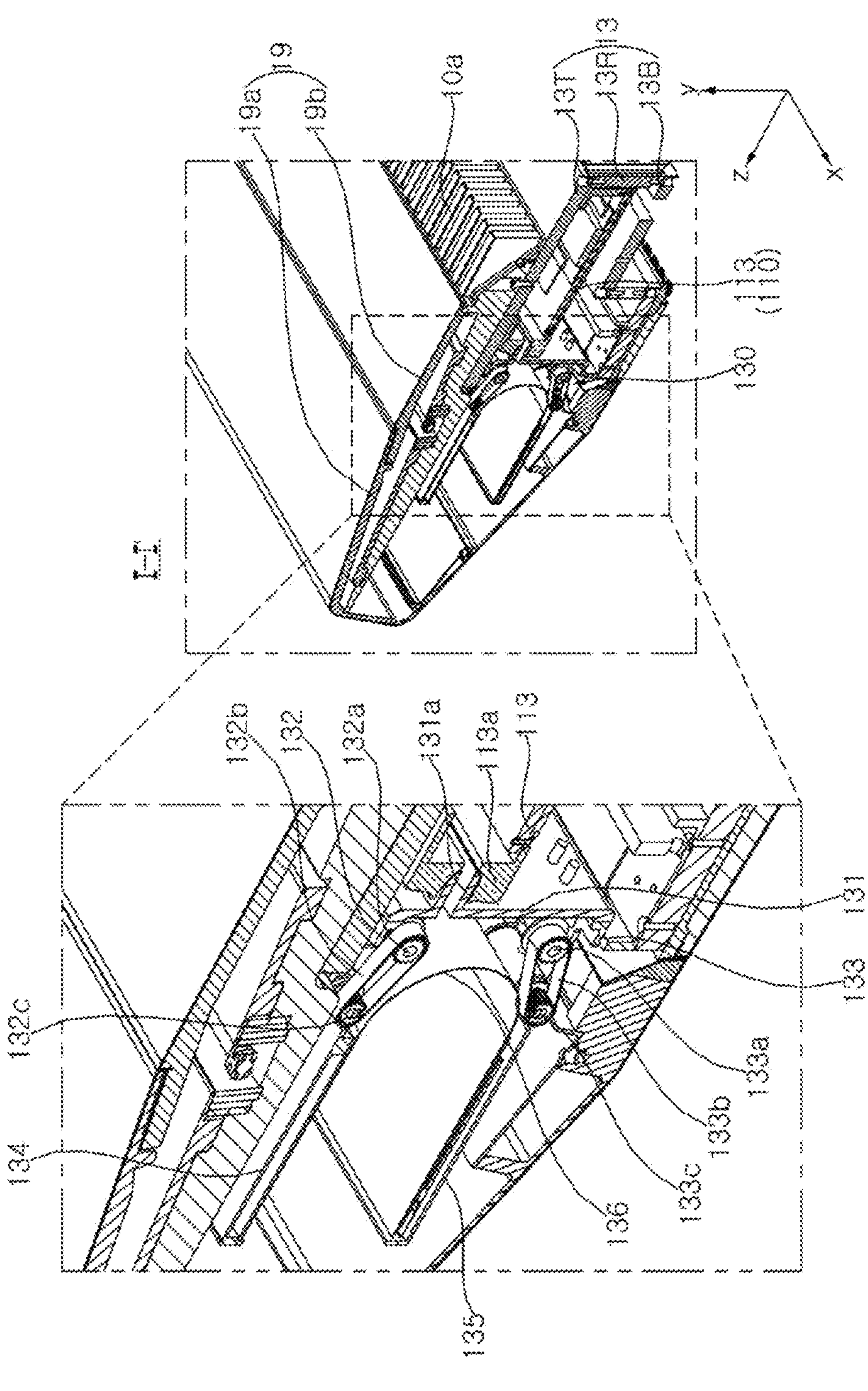

【FIG. 11】
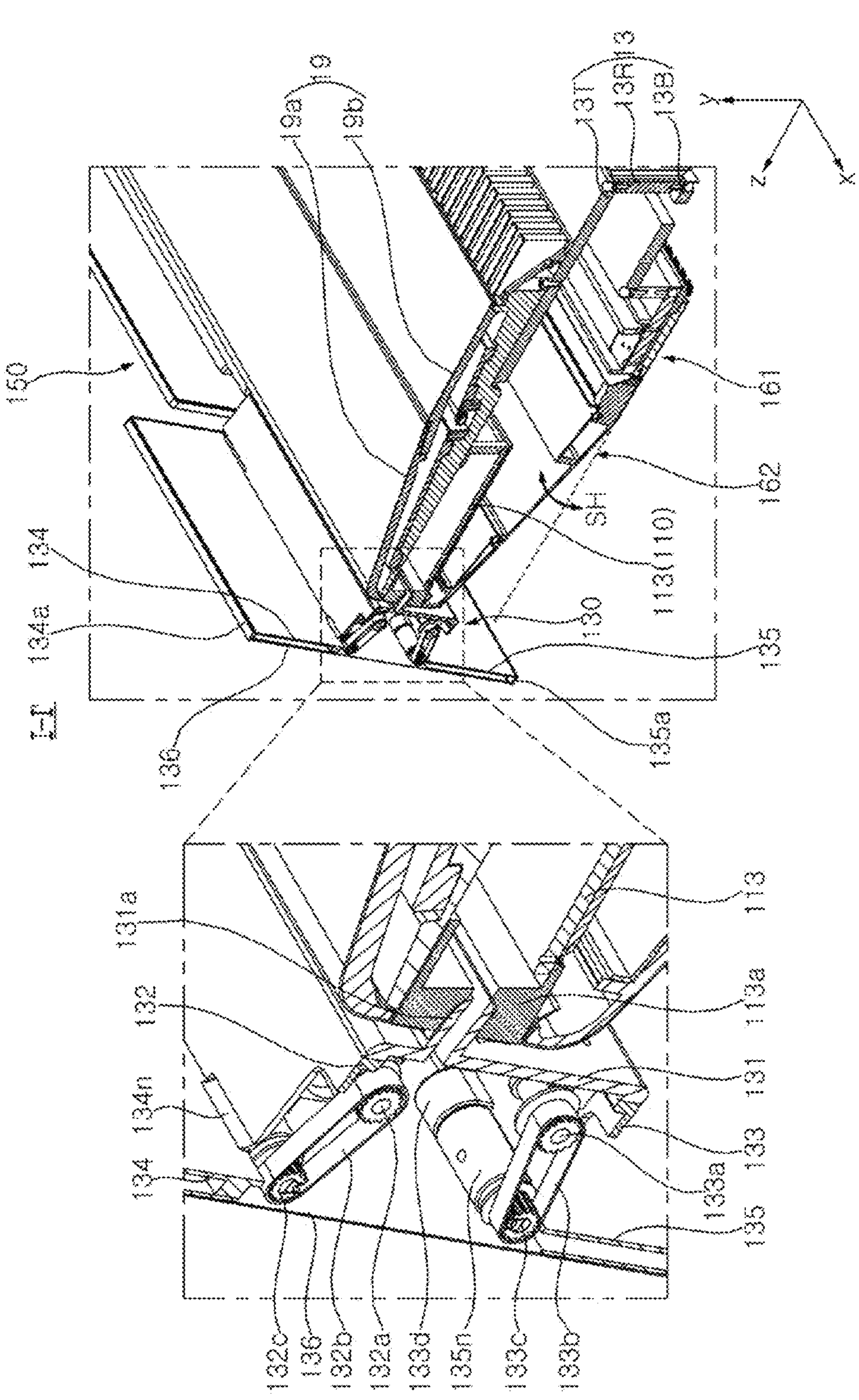

【FIG. 12】
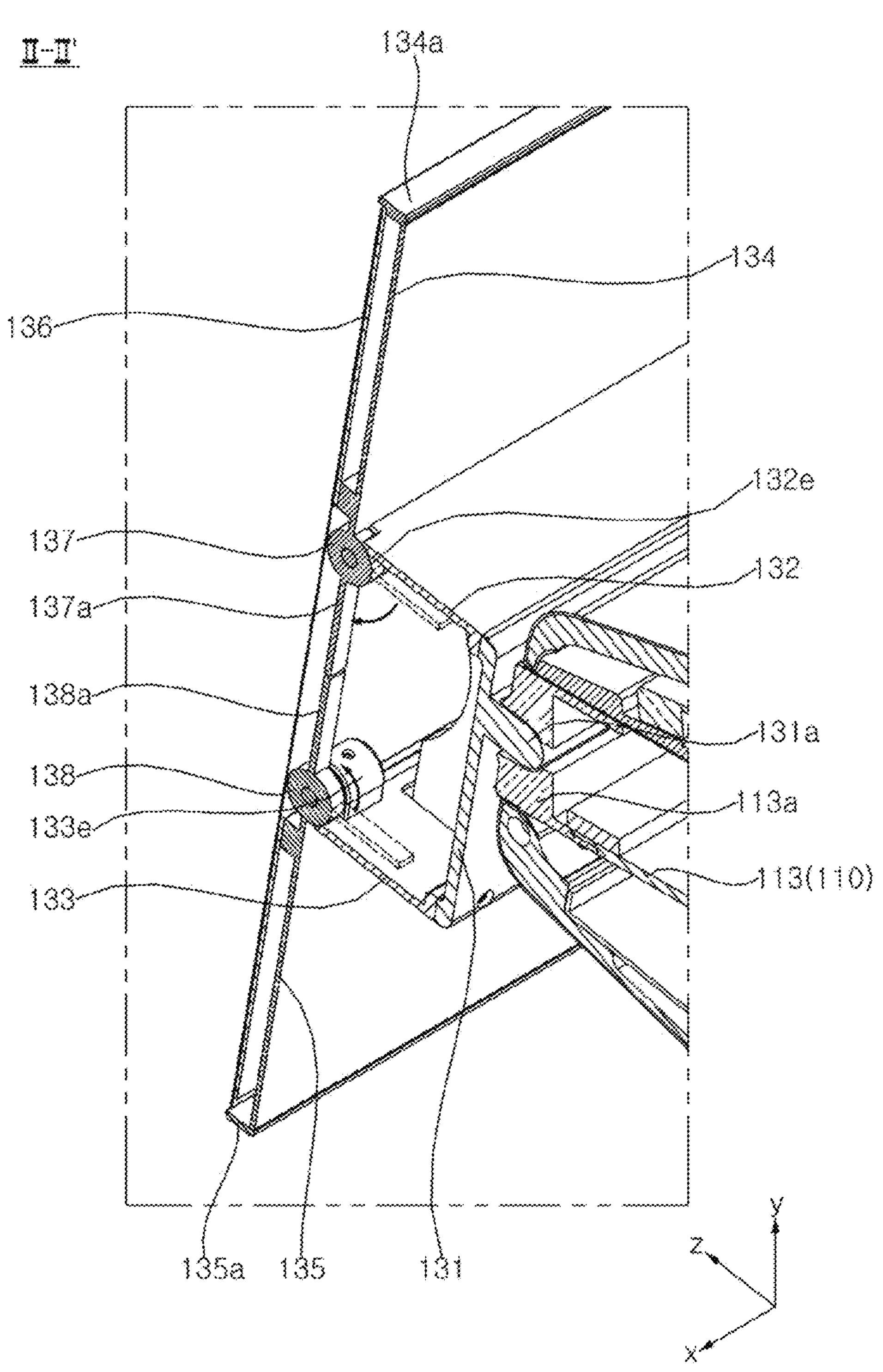

【FIG. 13】
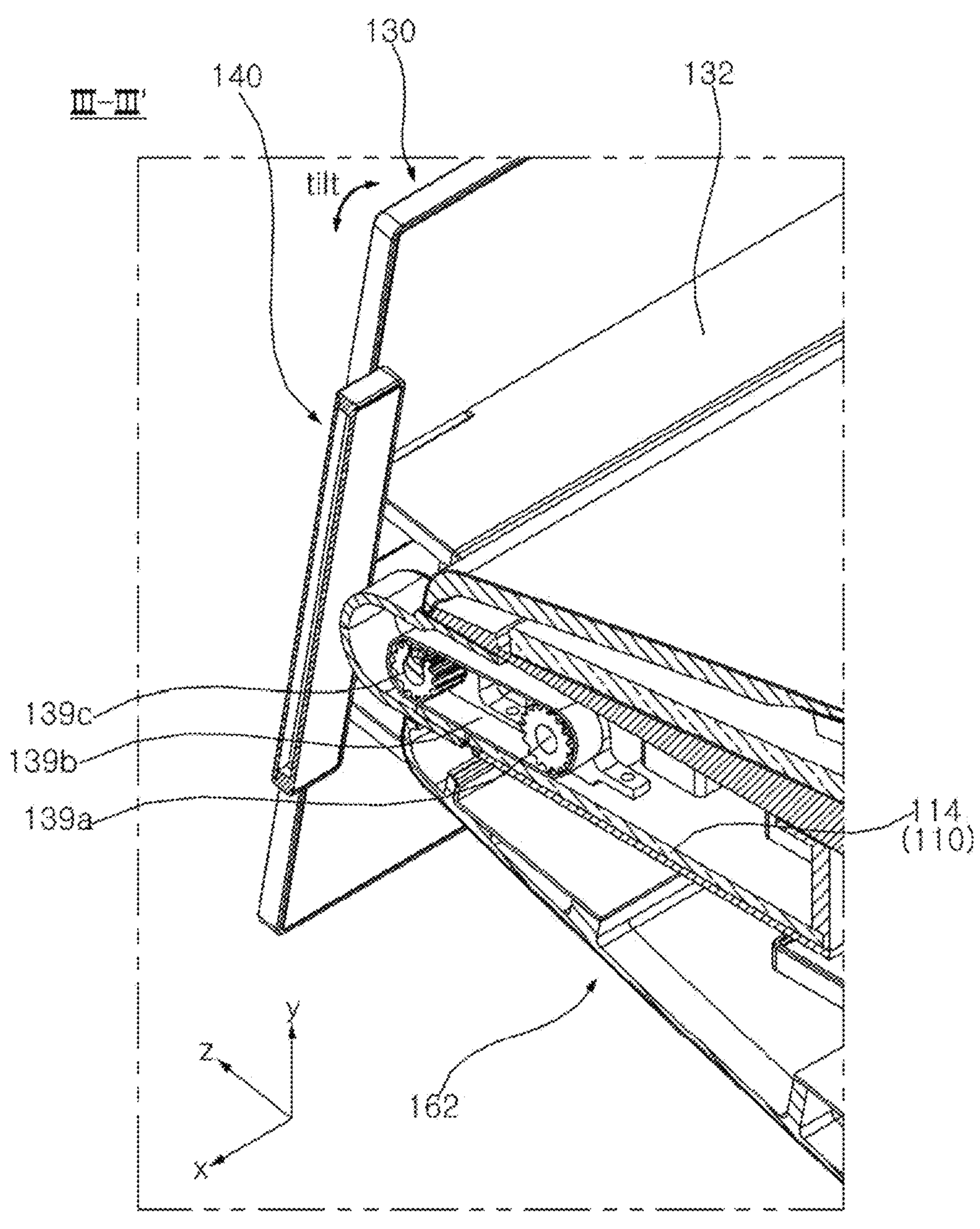

【FIG. 14】
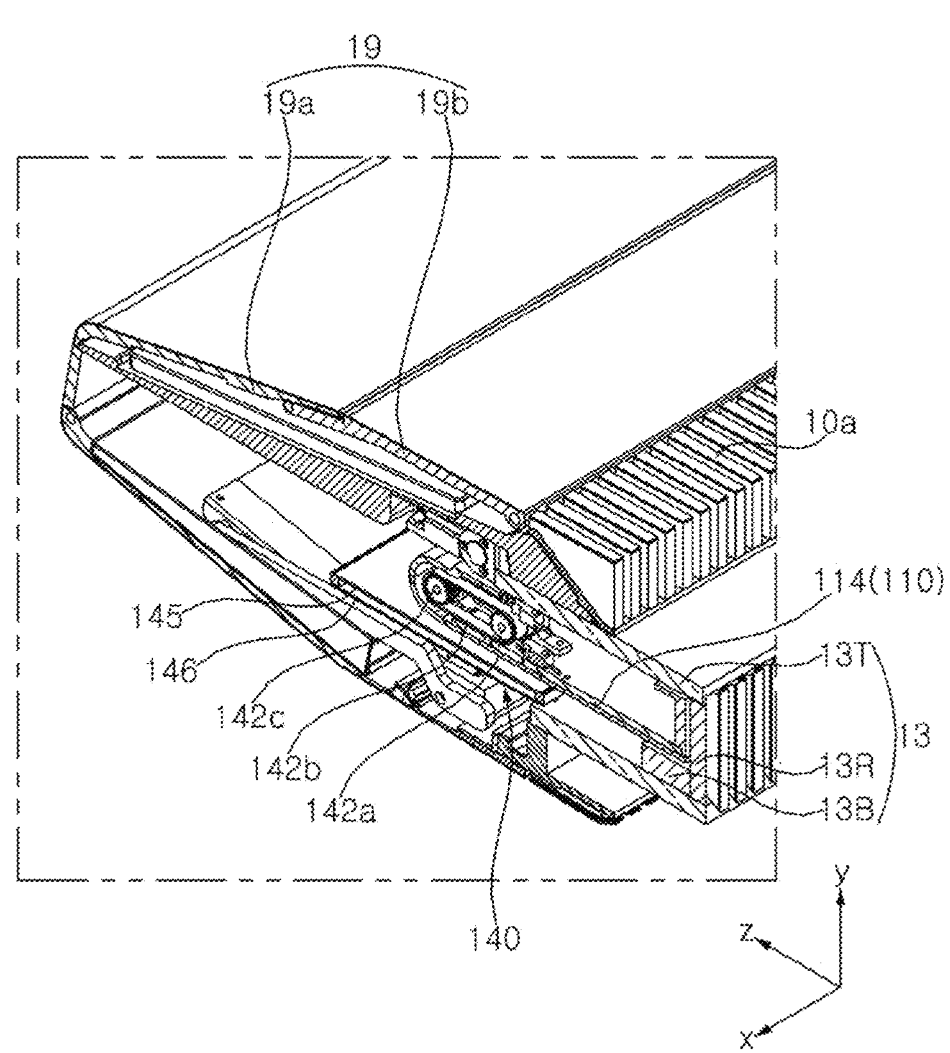

【FIG. 15】
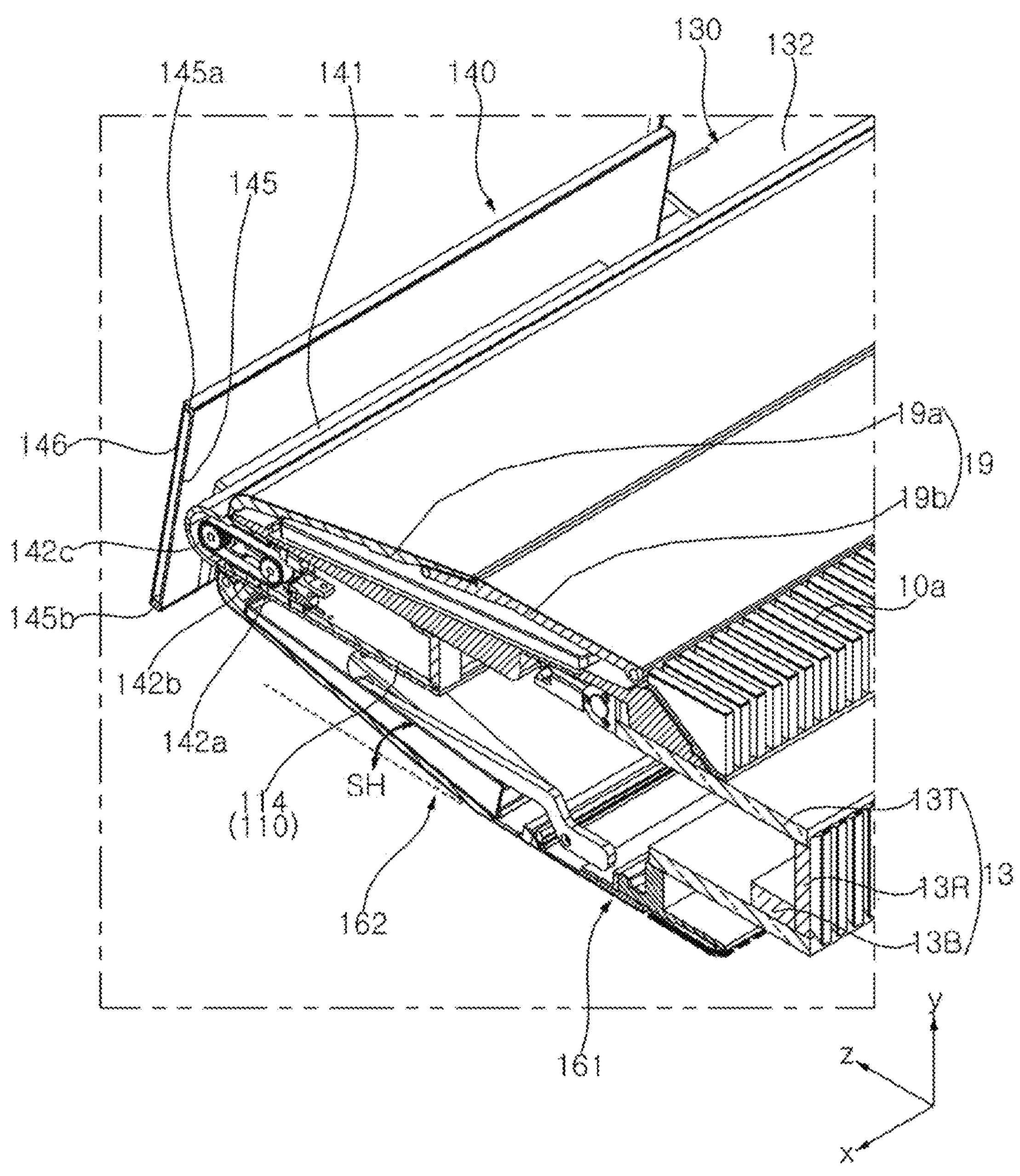

【FIG. 16】
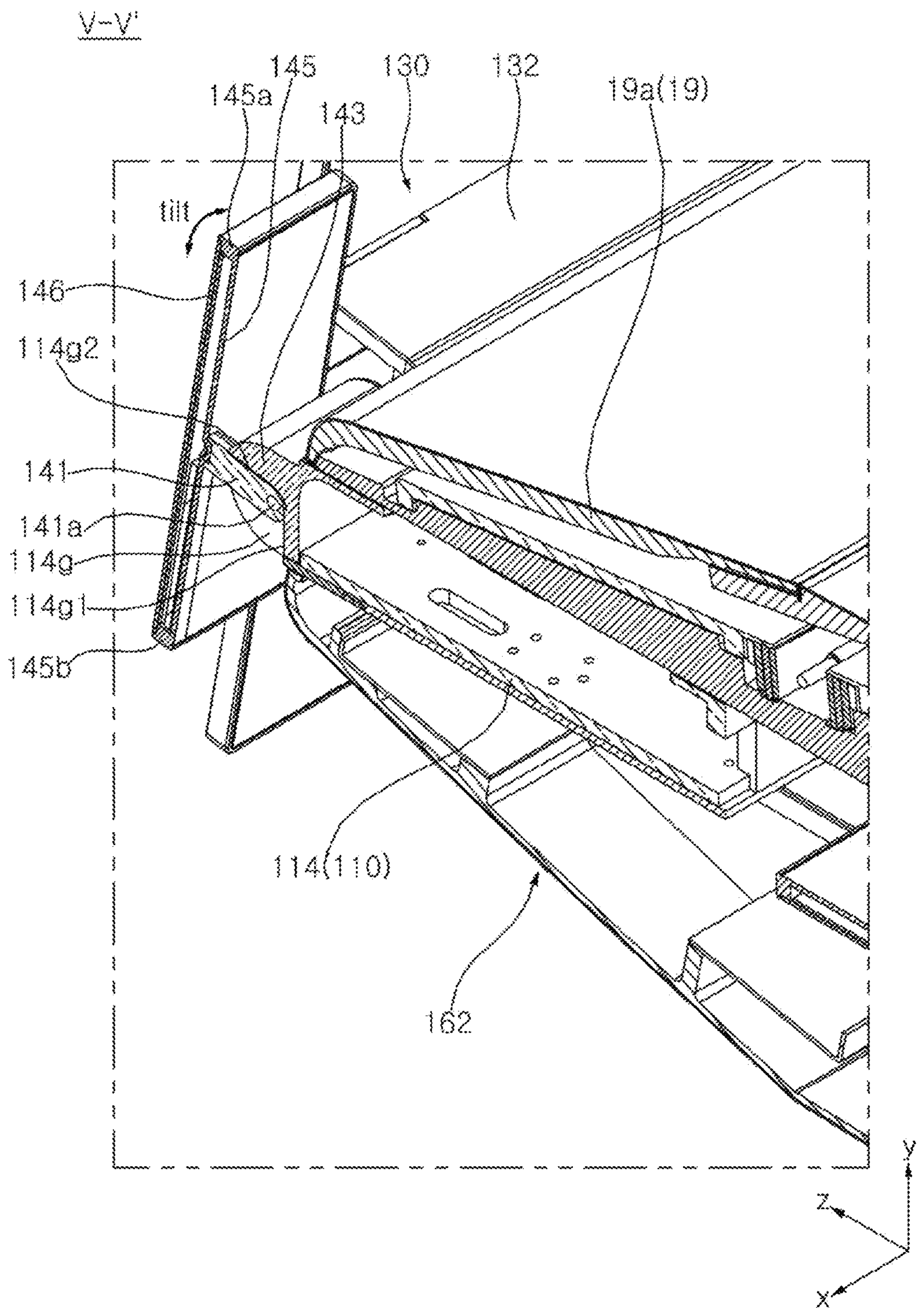

【FIG. 17】
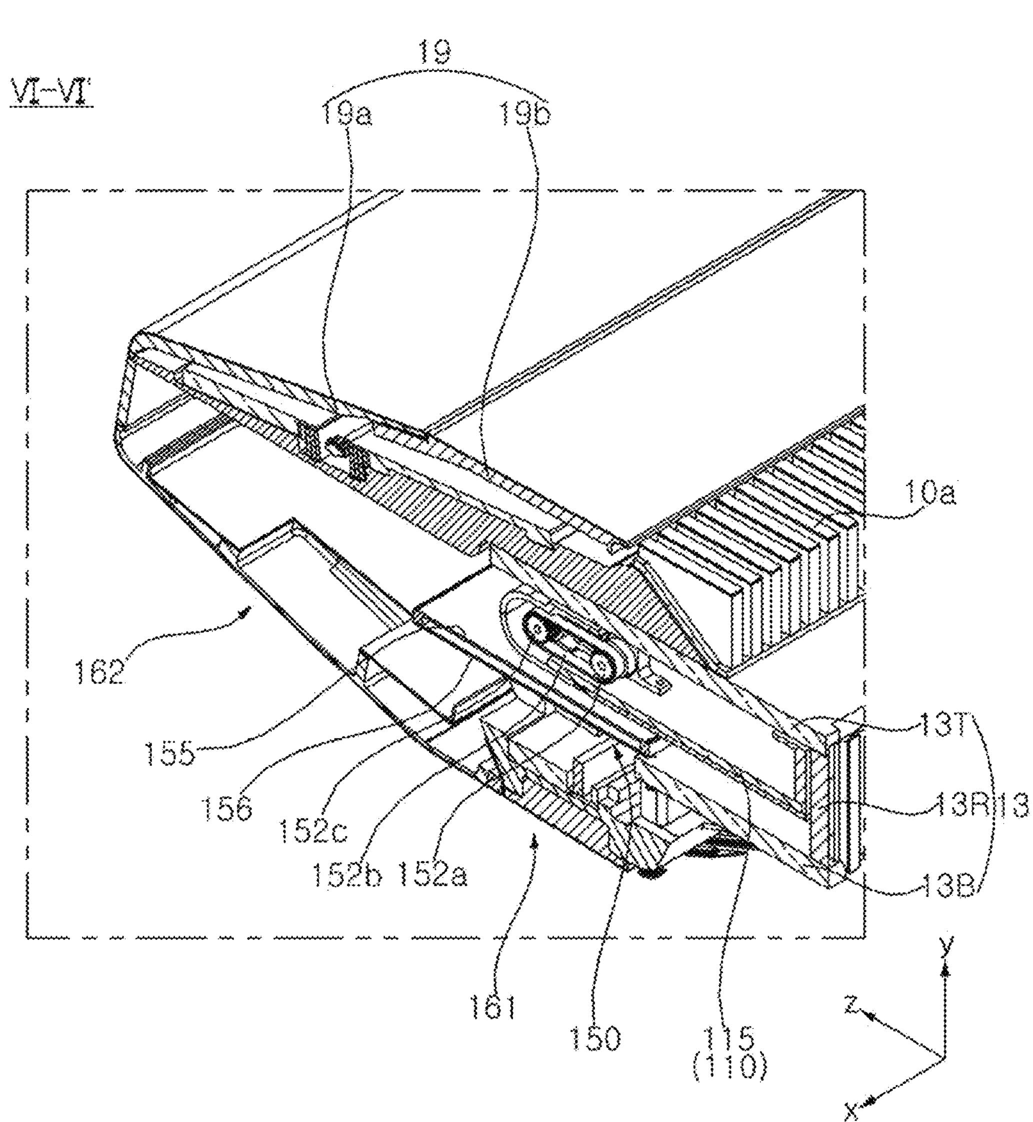

【FIG. 18】
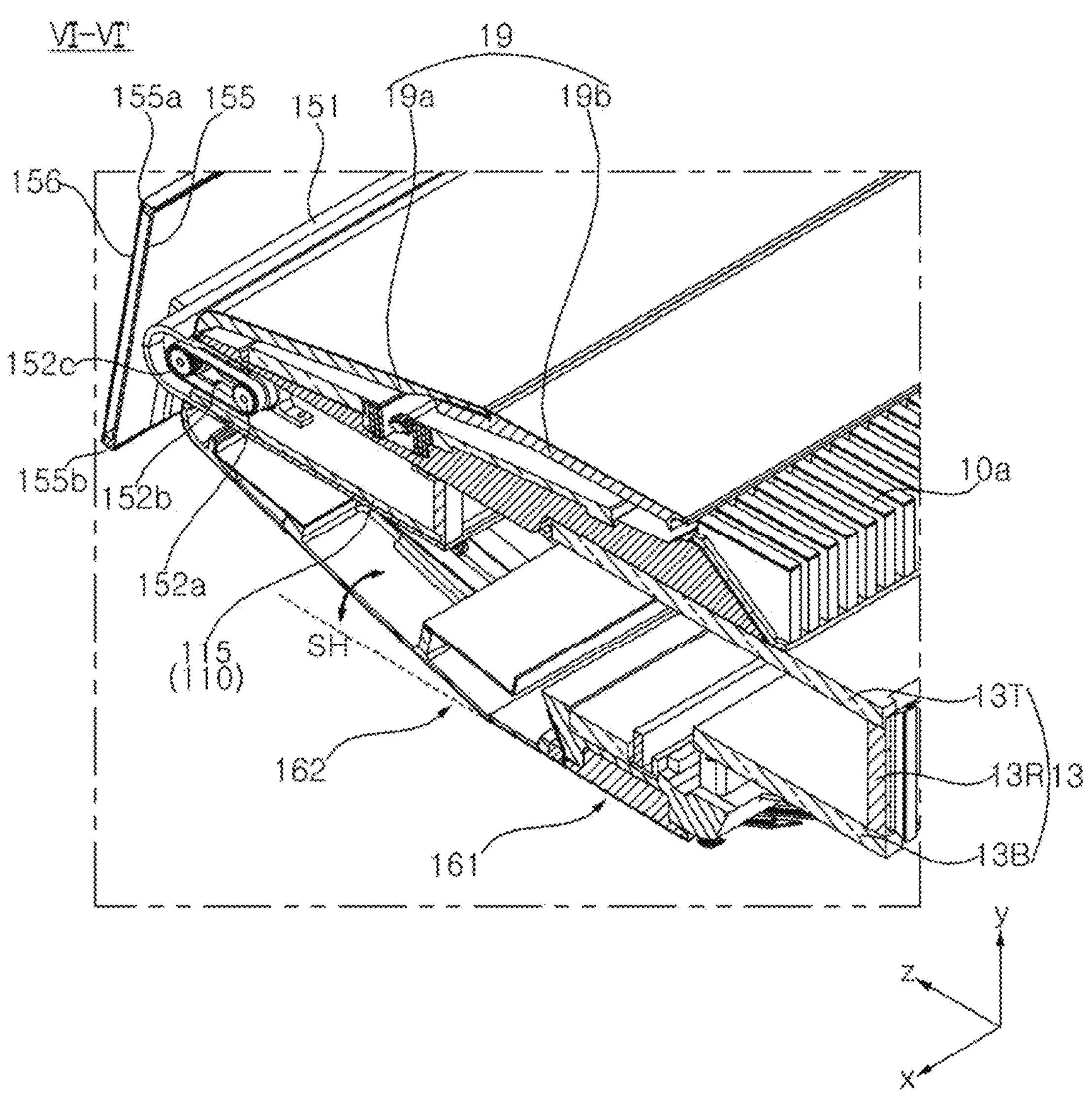

【FIG. 19】
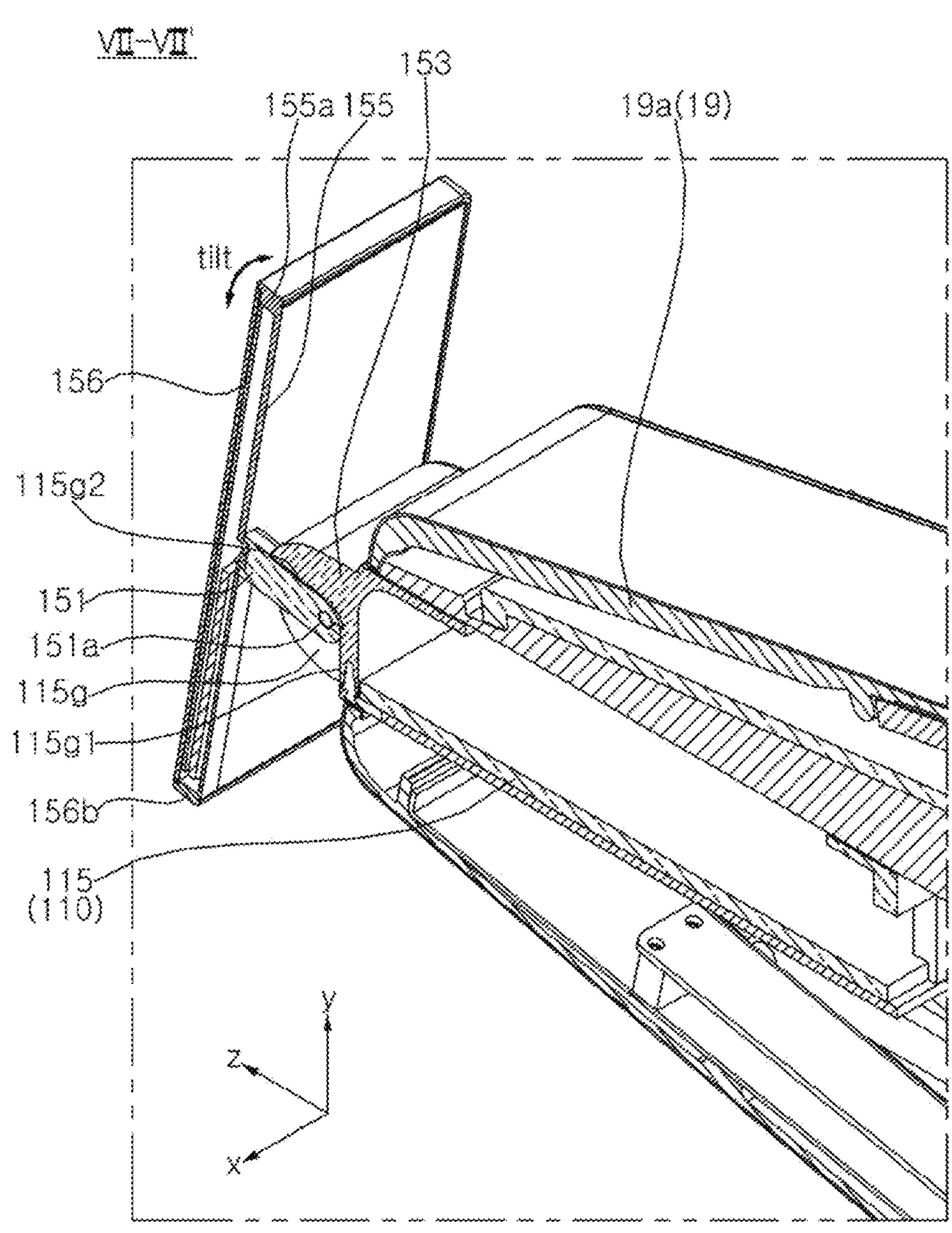

【FIG. 20】
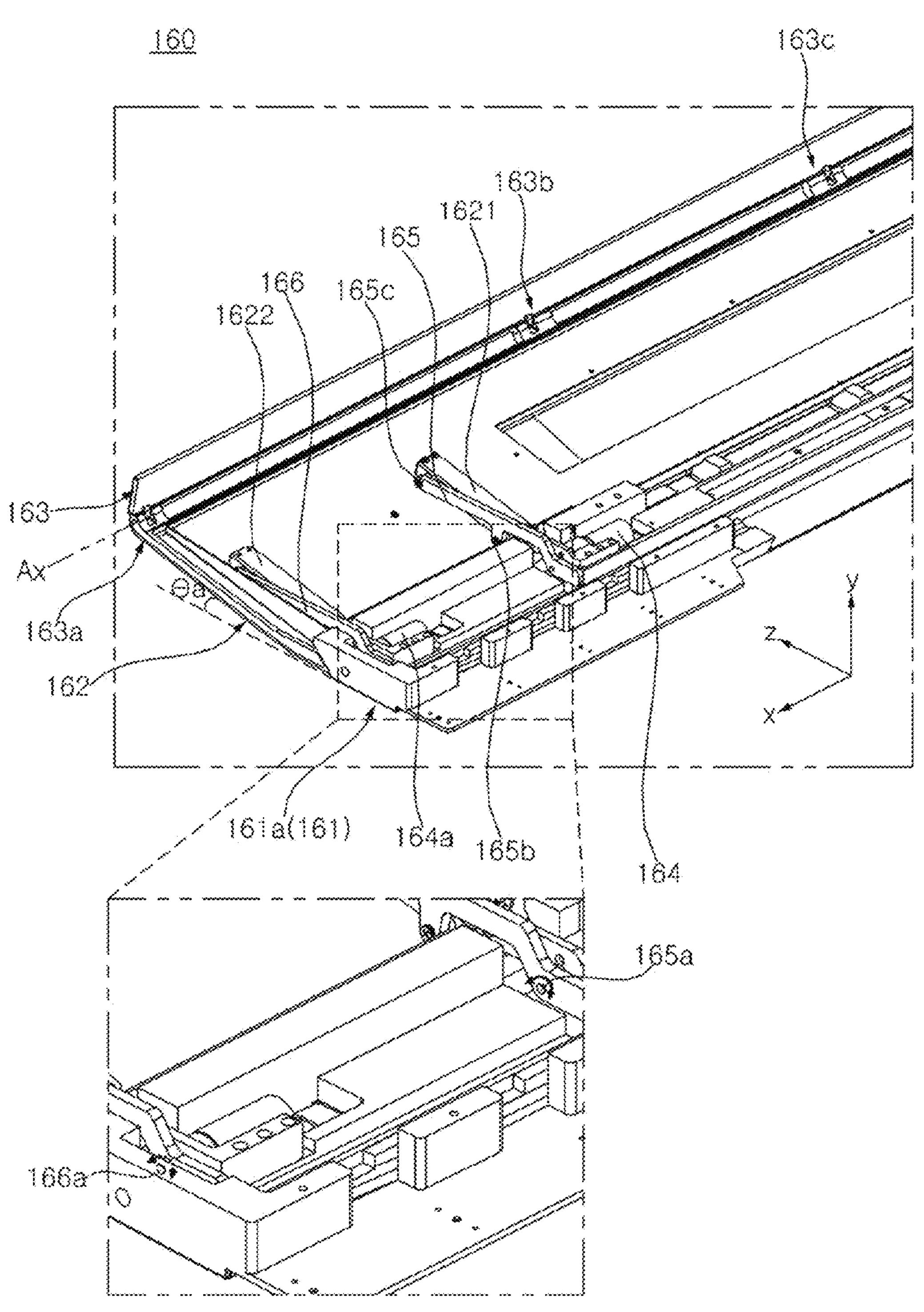

【FIG. 21】
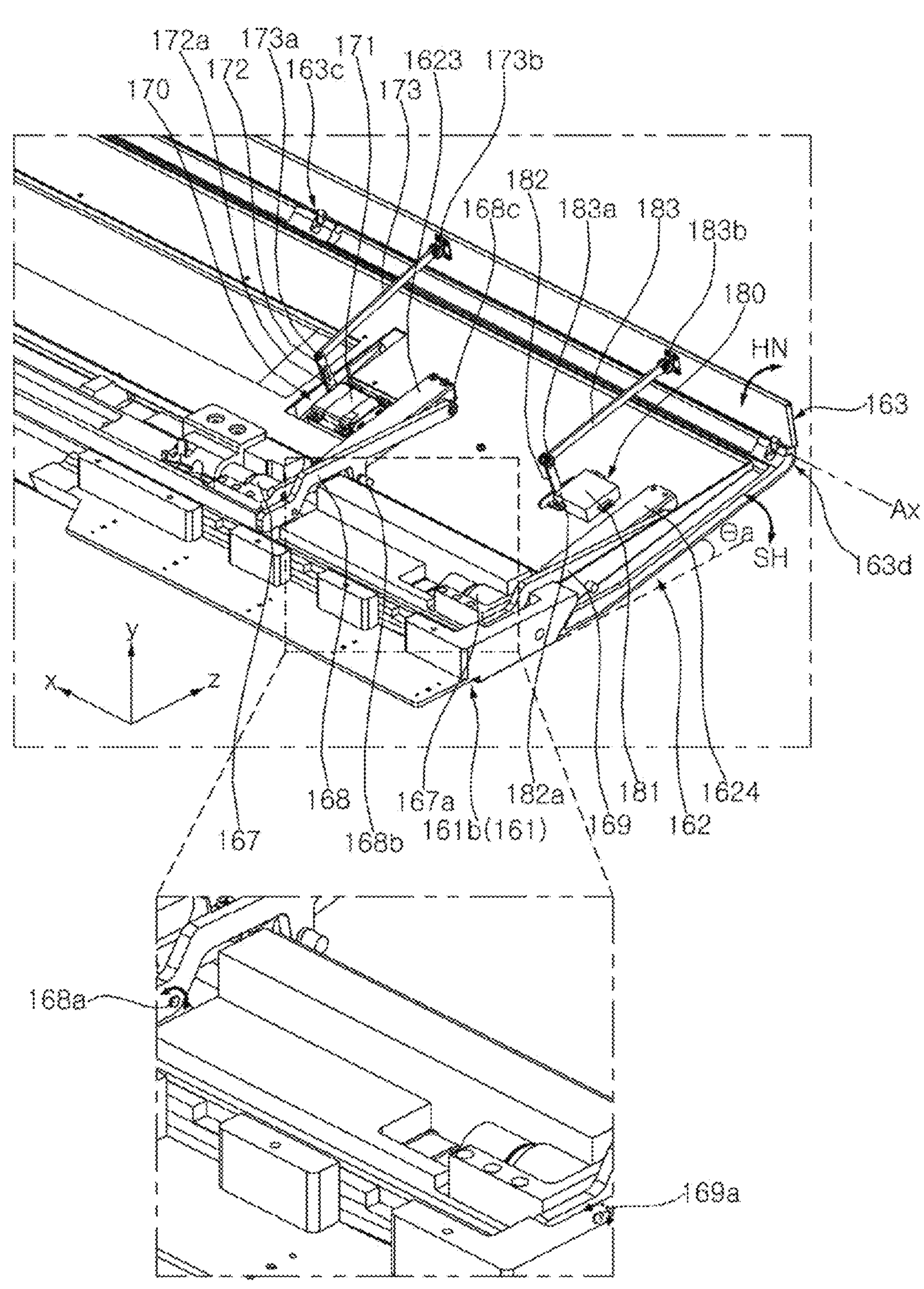

【FIG. 22】
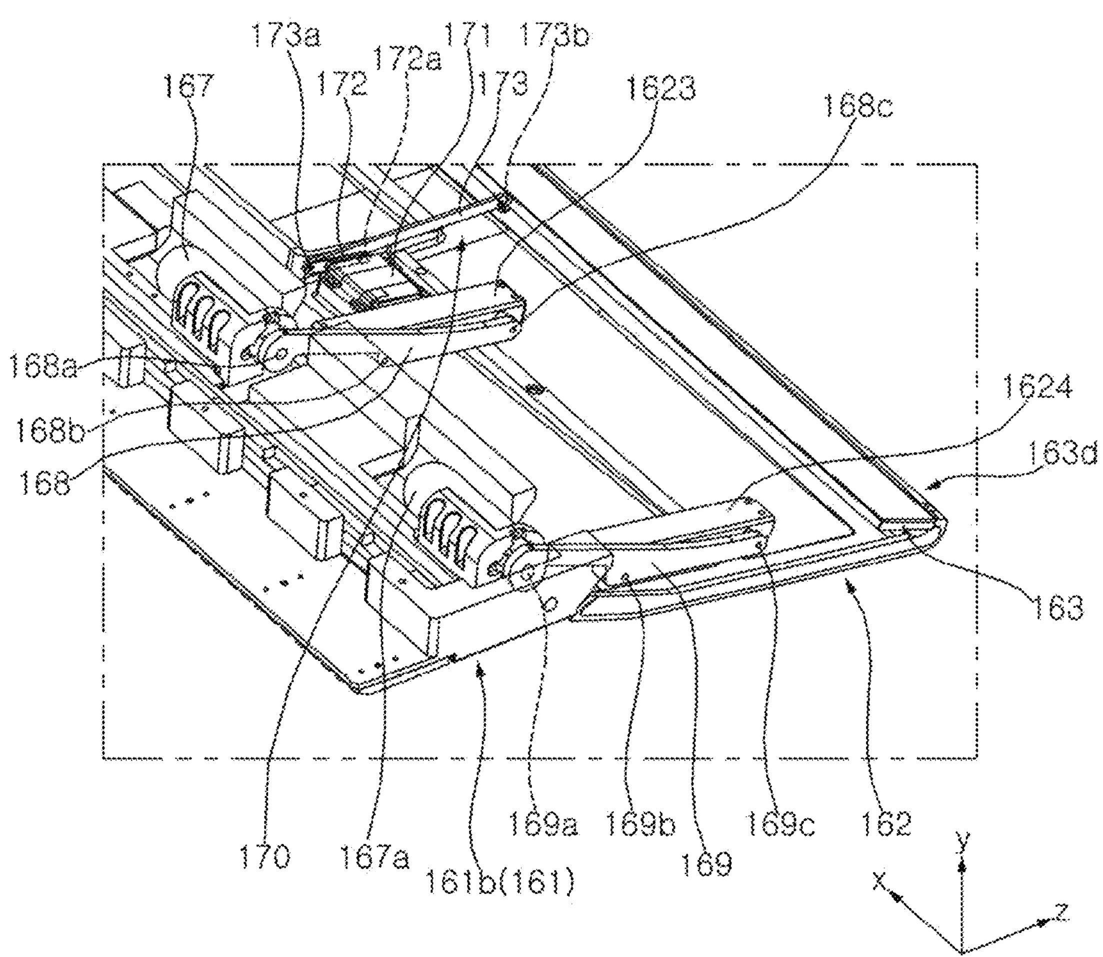

【FIG. 23】
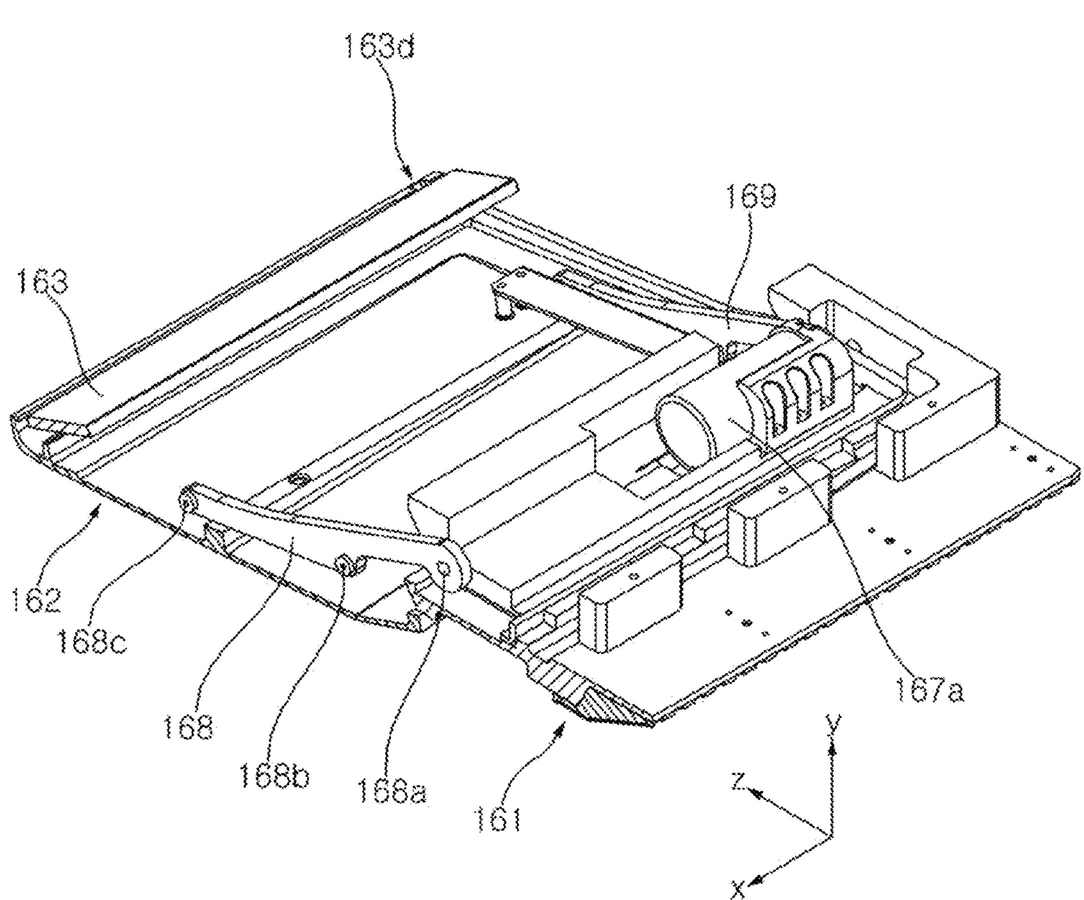

【FIG. 24】
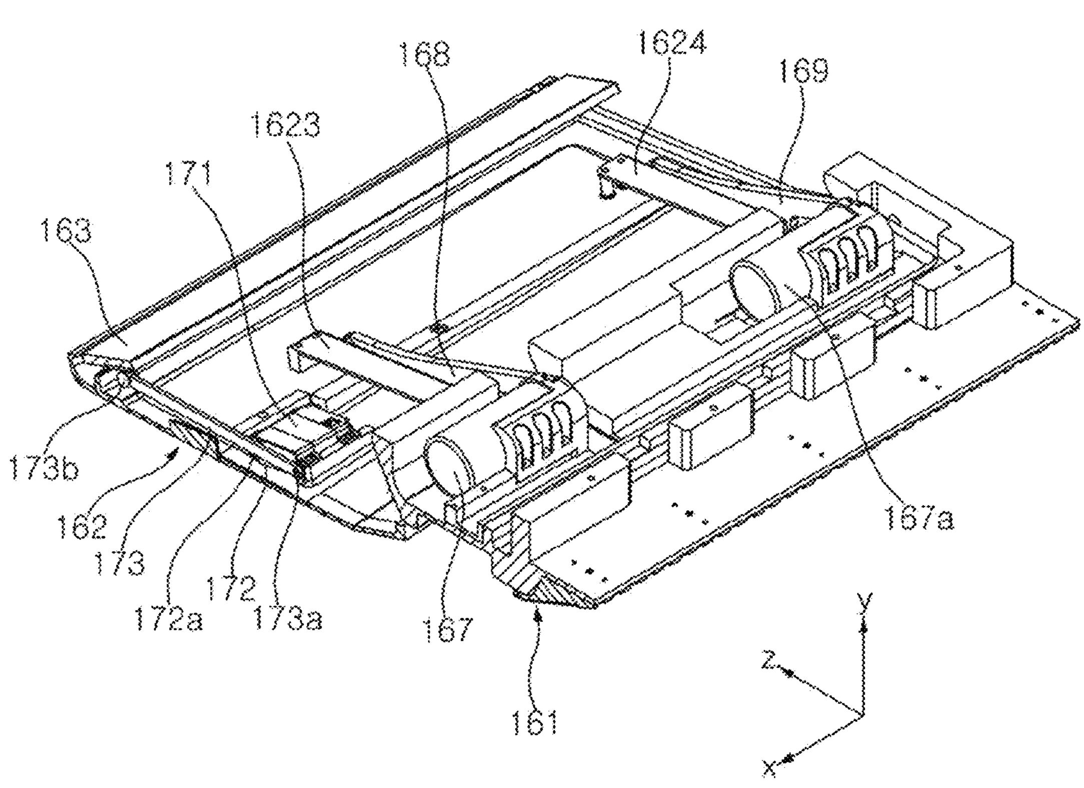

【FIG. 25】
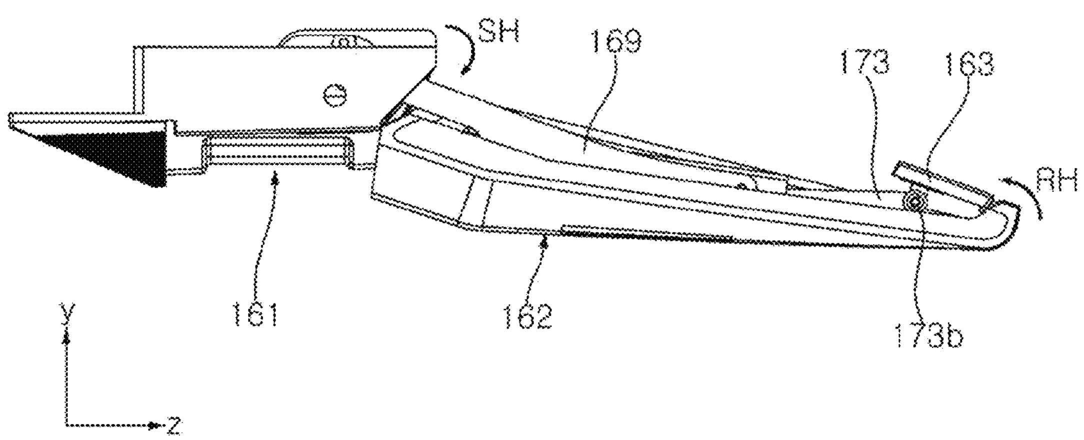

【FIG. 26】
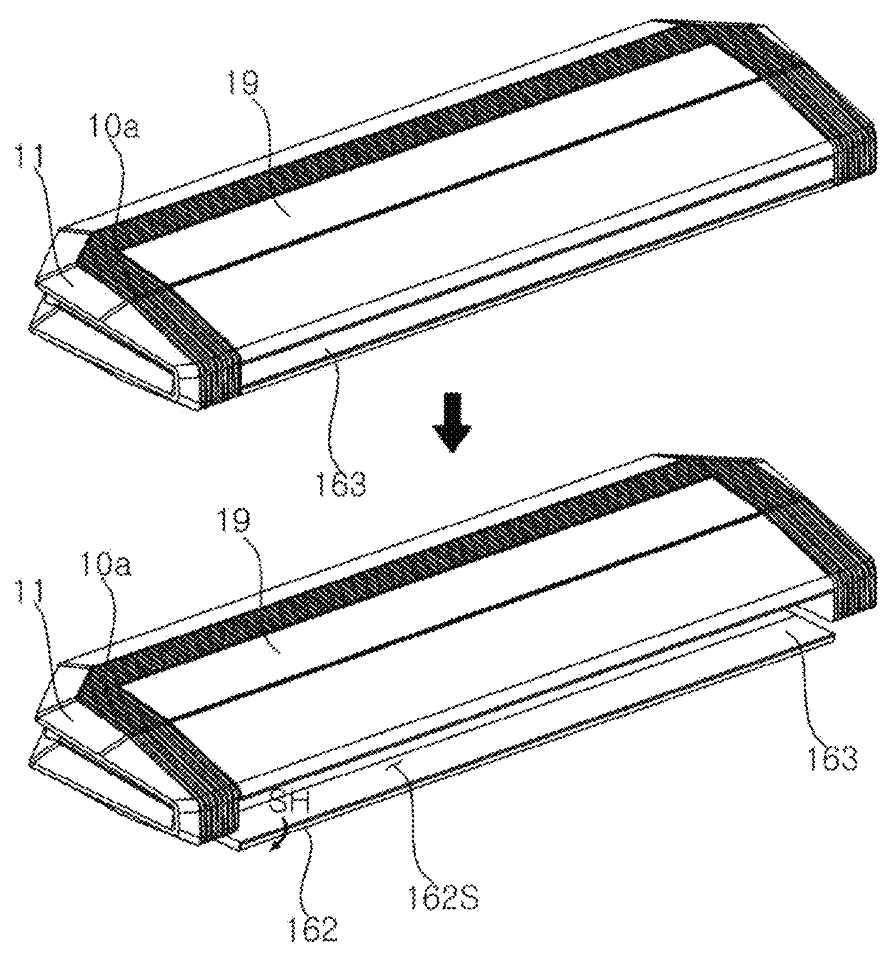

【FIG. 27】
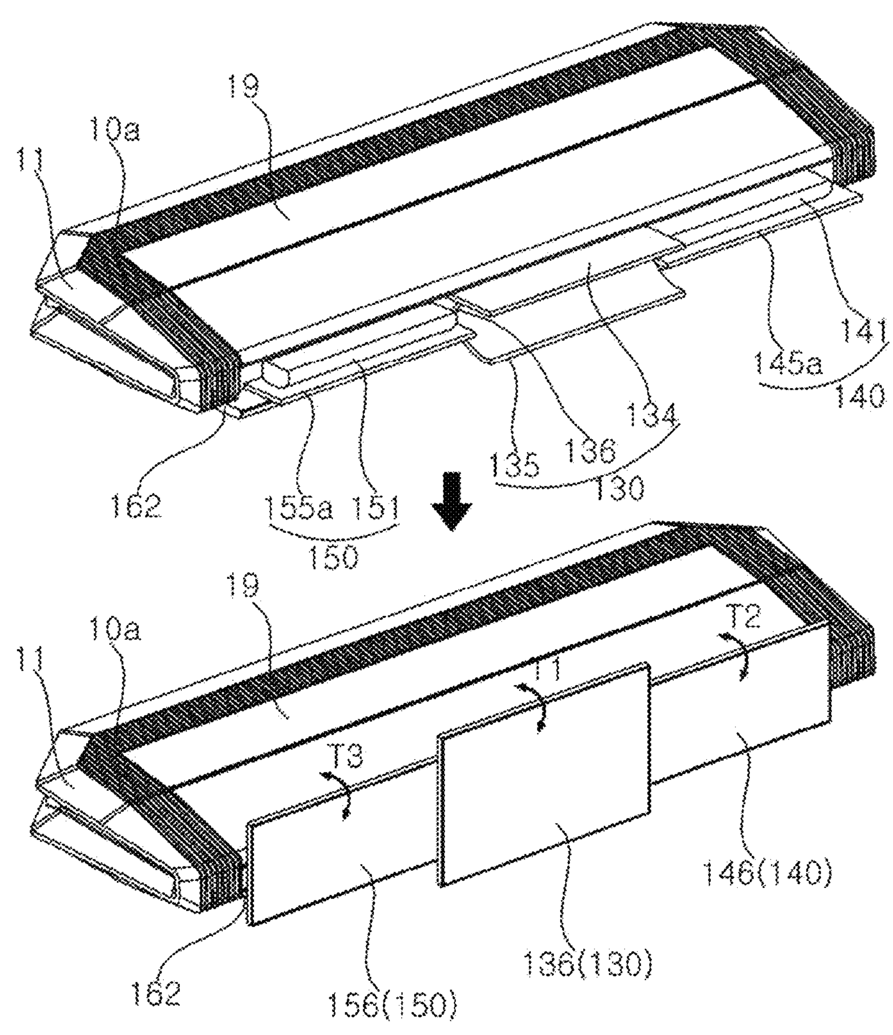

【FIG. 28】
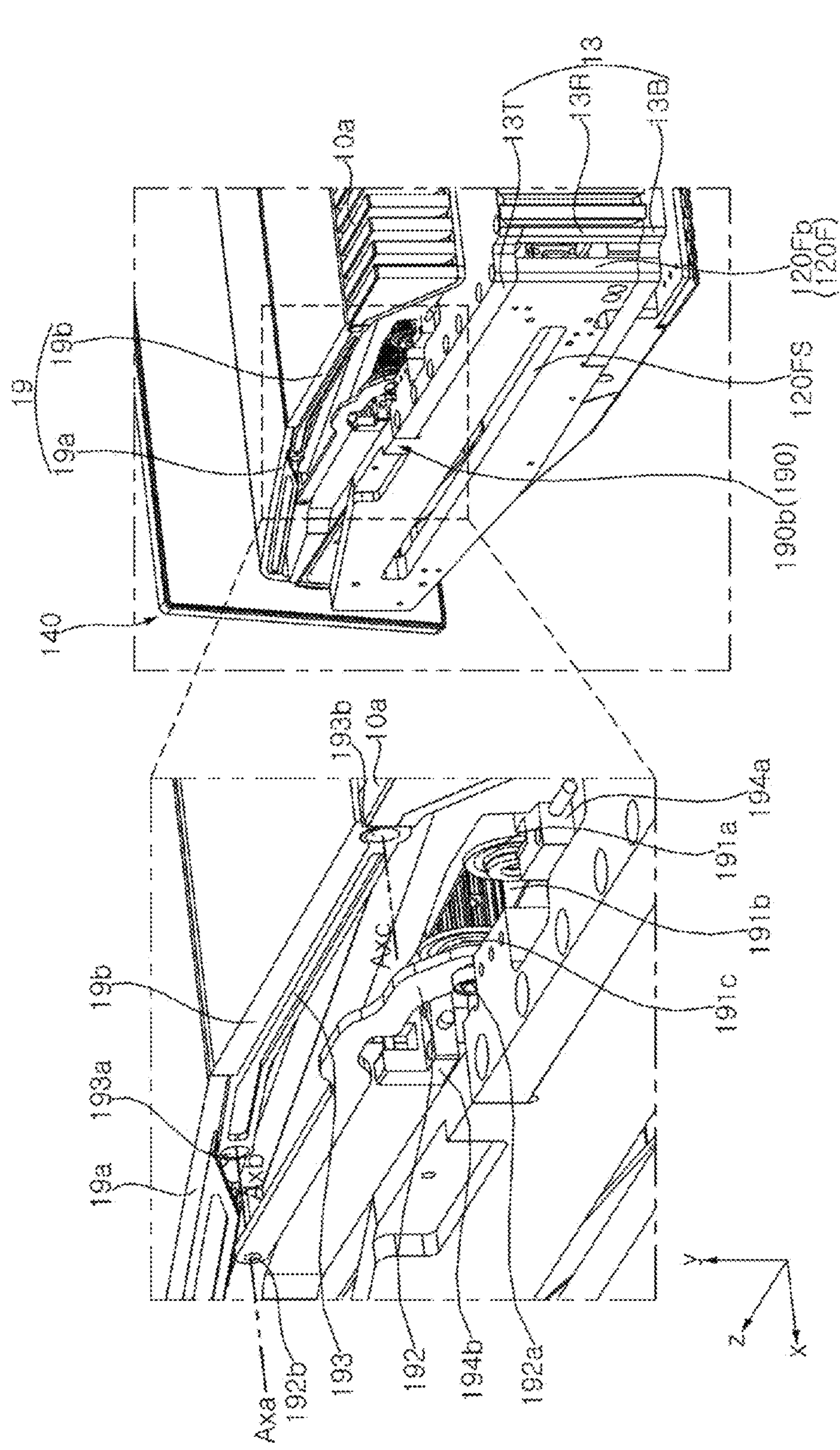

【FIG. 29】
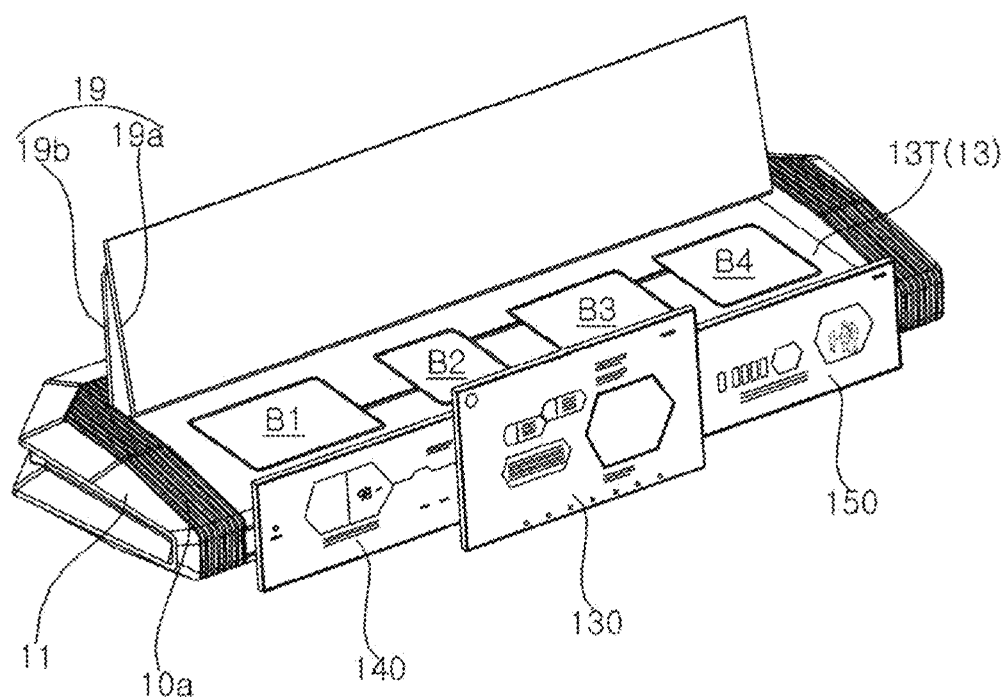

【FIG. 30】
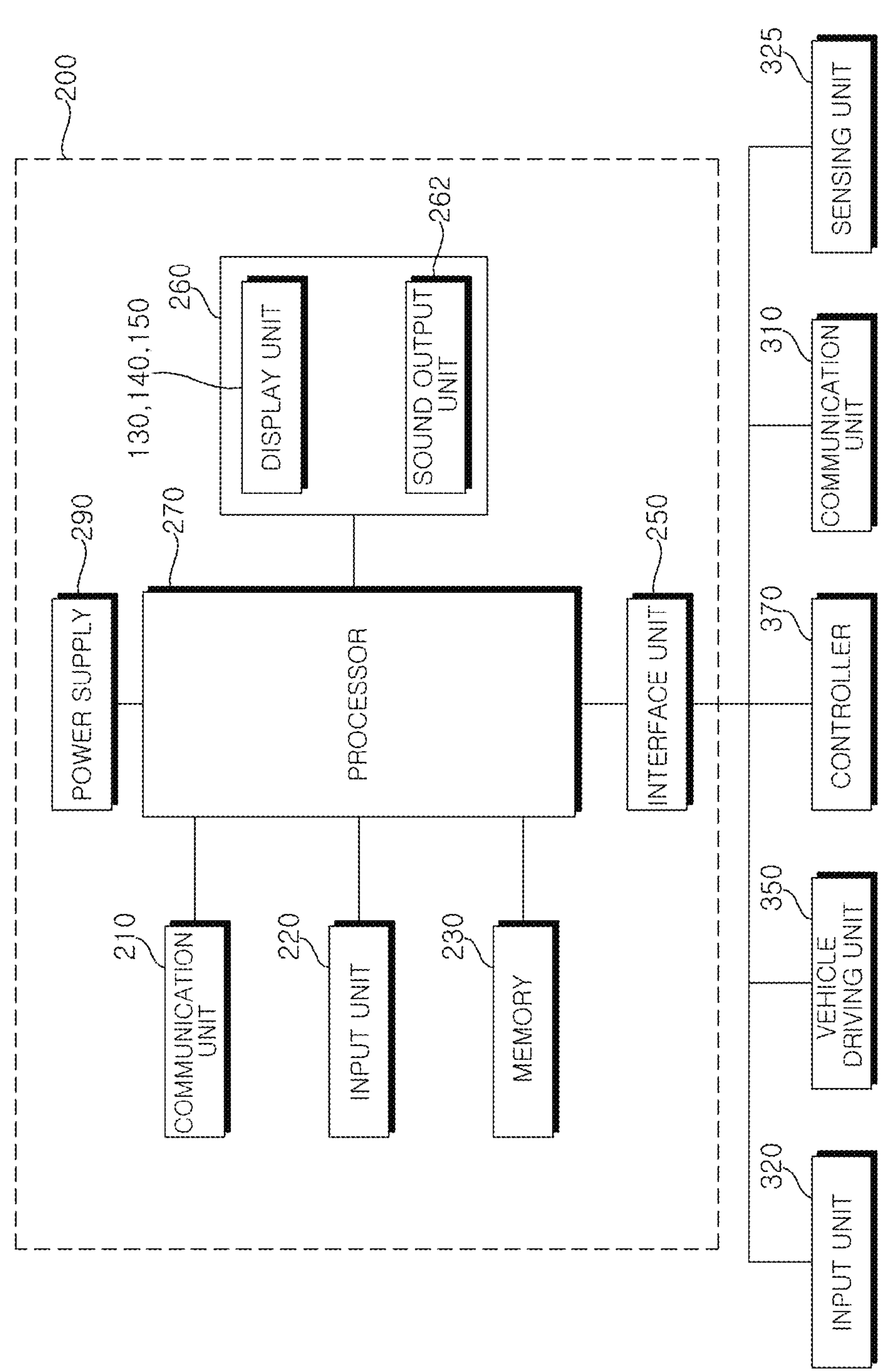

DISPLAY DEVICE FOR VEHICLE COMPRISING SLIDING ASSEMBLY

CROSS REFERENCE TO RELATED APPLICATIONS

This application is the National Phase of PCT International Application No. PCT/KR2022/003416, filed on Mar. 11, 2022, all of which is hereby expressly incorporated by reference into the present application.

TECHNICAL FIELD

The present disclosure relates to a display device for a vehicle.

BACKGROUND ART

With the advent of the information society, demand for display devices is increasing in various forms. Various display devices, such as liquid crystal display (LCD) devices, plasma display panel (PDP) devices, electroluminescent display (ELD) devices, vacuum fluorescent display (VFD) devices, and organic light-emitting diode (OLED) devices, have recently been studied and used to meet various demands for display devices. A display device using an organic light-emitting diode (OLED) has an advantage that it can be implemented in an ultra-thin form because it has excellent luminance and viewing angle characteristics and does not require a backlight unit compared to a liquid crystal display device.

A vehicle is a transportation means that is operated by a driver. In order to operate a vehicle, a driver needs information about the state of the vehicle, and the vehicle provides information about the state of the vehicle to the driver through an analog display device or a digital display. As the functions and performance of vehicles develop, more types of information may be provided to a driver than before, and research is being conducted on displays for safe and space-efficient provision of information due to the structural characteristics of vehicles that should ensure passenger safety and have a limitation in space.

Recently, autonomous vehicles capable of driving autonomously without intervention by a driver have been developed. In such an autonomous vehicle, a driver or a passenger may receive not only information necessary for operation of the vehicle but also information for business or convenience. In-vehicle infotainment (IVI) means that devices mounted in a vehicle provide not only information related to driving, such as the state of the vehicle and navigation, but also entertainment for a user. In-car entertainment (ICE) means provision of media content for a user in a vehicle.

Recently, much research has been conducted on such a display device for vehicles.

DETAILED DESCRIPTION OF INVENTION

Technical Problems

It is an object of the present disclosure to solve the above and other problems.

Another object may be to provide a display device for a vehicle that is variable.

Another object may be to provide a display device for a vehicle provided with a variable mechanism.

Technical Solution

According to one aspect of the present disclosure for accomplishing the above or other objects, a display device for a vehicle may include: a housing with an open side; a sliding assembly located in the housing and including a slider which is movable away from or toward the opening; a body located in the housing and fixed to the slider; and a display coupled to the body, and which is movable out of the housing through the opening, the display may include a display panel; and a swing module which is located between the display panel and the body, to which the display panel is coupled, and which is rotatably coupled to the body, and a rotation axis of the swing module may intersect a movement direction of the body.

Effect of Invention

A display device for a vehicle according the present disclosure has the following effects.

According to at least one of embodiments of the present disclosure, a display device for a vehicle that is variable may be provided.

According to at least one of embodiments of the present disclosure, a display device for a vehicle provided with a variable mechanism may be provided.

The additional scope of applicability of the present disclosure will be apparent from the following detailed description. However, those skilled in the art will appreciate that various modifications and alterations are possible, without departing from the idea and scope of the present disclosure, and therefore it should be understood that the detailed description and specific embodiments, such as the preferred embodiments of the present disclosure, are provided only for illustration.

BRIEF DESCRIPTION OF THE DRAWING

FIGS. 1 to 30 are views showing examples of a display device for a vehicle according to embodiments of the present disclosure.

MODE FOR CARRYING OUT THE INVENTION

Hereinafter, the embodiments disclosed in the present specification will be described in detail with reference to the accompanying drawings, and the same or similar elements are denoted by the same reference numerals even though they are depicted in different drawings, and redundant descriptions thereof will be omitted.

The suffixes “module” and “unit” for constituent elements used in the following description are given or used interchangeably only for ease of description of the specification, and do not have mutually distinguished meanings or roles in themselves.

In the following description of the embodiments disclosed in the present specification, a detailed description of known functions and configurations incorporated herein will be omitted when the same may make the subject matter of the embodiments disclosed in the present specification rather unclear. In addition, the accompanying drawings are provided only for a better understanding of the embodiments disclosed in the present specification and are not intended to limit the technical ideas disclosed in the present specification. Therefore, it should be understood that the accompanying drawings include all modifications, equivalents, and substitutions within the scope and sprit of the present disclosure.

It will be understood that although the terms “first”, “second”, etc., may be used herein to describe various components, these components should not be limited by these terms. These terms are only used to distinguish one component from another component.

It will be understood that when a component is referred to as being "connected to" or "coupled to" another component, it may be directly connected to or coupled to the other component, or intervening components may be present. On the other hand, when a component is referred to as being "directly connected to" or "directly coupled to" another component, there are no intervening components present.

As used herein, the singular form is intended to include the plural forms as well, unless the context clearly indicates otherwise.

It will be further understood that the term "comprise" or "include", when used herein, specifies the presence of stated features, integers, steps, operations, elements, components, or combinations thereof, but does not preclude the presence or addition of one or more other features, integers, steps, operations, elements, components, or combinations thereof.

Representations of directions illustrated in the drawings, such as up (U), down (D), left (Le), right (Ri), front (F), and rear (R), are merely for convenience of explanation, and are not intended to limit the technical features disclosed in this specification.

Referring to FIG. 1, a display device may be mounted in a cabin 1 of a vehicle. The display device may be referred to as a vehicular digital cockpit. A plurality of display devices may be mounted in the cabin 1 of the vehicle.

A main display device 3 may be mounted on a dashboard 2 of the vehicle. The main display device 3 may include a cluster 3*a*, a center information display (CID) 3*b*, and a co-driver display (CDD) 3*c*. The cluster 3*a* may provide information to a driver, the co-driver display 3*c* may provide information to a passenger on a front passenger seat, and the center information display 3*b* may provide information to occupants.

A head-up display (HUD) 4 may be mounted on the dashboard 2, and may display information on a front windshield of the vehicle. The head-up display 4 may provide information to the driver while the driver is looking ahead of the vehicle.

A rear seat entertainment (RSE) 5 may be mounted on a rear surface of the head rest of the driver seat and/or a rear surface of the head rest of the front passenger seat. The rear seat entertainment 5 may provide information to a passenger sitting on the rear seat.

Referring to FIG. 2, a display device 10, as the main display device 3 described above with reference to FIG. 1, may be mounted on the dashboard of the vehicle. The display device 10 may be referred to as a vehicular display device 10.

The display device 10 may extend long in a leftward-rightward direction. The height Ha of the display device 10 may be defined in an upward-downward direction, and may be less than the length La of the display device 10. The width Wa of the display device 10 may be defined in a forward-backward direction, and may be greater than the height Ha of the display device 10 but less than the length La of the display device 10.

A side cover 11 may extend along the periphery of the display device 10, and may cover the lateral side of the display device 10. A top cover 19 may cover the upper surface of the display device 10. A front cover 163 may cover the front surface of the display device 10. The front cover 163 may be referred to as a flap 163.

Heat dissipation holes 10*a* may be located between the side cover 11 and the top cover 19, and may be formed along the periphery of the display device 10.

Referring to FIGS. 2 and 3, a first side wall 12R and a second side wall 12L may be located inside the side cover 11. The first side wall 12R may be located on the right side of the top cover 19 and the front cover 163, and the second side wall 12L may be located on the left side of the top cover 19 and the front cover 163.

In this case, the first side wall 12R and the second side wall 12L may be fixed in position. For example, the first side wall 12R and the second side wall 12L may be bilaterally symmetrical to each other.

Referring to FIGS. 4 and 5, the first side wall 12R may be open in a direction toward the second side wall 12L, i.e., to the left. A first sliding assembly 120*a* may be mounted in an inner space in the first side wall 12R. The first sliding assembly 120*a* may include a motor 121, a power transmission member 121*a*, 121*b*, and 121*c*, a lead screw 122, a slider 123, and holders 122*a* and 122*b*.

The motor 121 may provide rotational force. The motor 121 may be an electric motor configured to be adjustable in rotational direction, rotational angle, and rotational speed, and may include a rotation shaft parallel to the leftward-rightward direction. The motor 121 may be adjacent to the rear end of the first side wall 12R, and may be fixed to an inner side of the first side wall 12R.

The power transmission member 121*a*, 121*b*, and 121*c* may transmit power from the motor 121 to the lead screw 122. The power transmission member 121*a*, 121*b*, and 121*c* may include a drive pulley 121*a*, a driven pulley 121*c*, and a belt 121*b*. The drive pulley 121*a* may be orthogonal to the rotation shaft of the motor 121, may be fixed to the rotation shaft, and may be spaced apart from the driven pulley 121*c*. The belt 121*b* may be engaged with the drive pulley 121*a* and the driven pulley 121*c*, and may be referred to as a timing belt. Accordingly, the belt 121*b* may transmit rotation of the drive pulley 121*a* to the driven pulley 121*c*.

The lead screw 122 may extend in the forward-backward direction. The rear end of the lead screw 122 may be adjacent to the rear end of the first side wall 12R, and may be fixed to the driven pulley 121*c*. The front end of the lead screw 122 may be adjacent to the front end of the first side wall 12R. The lead screw 122 may include male threads formed on the outer peripheral surface thereof.

The slider 123 may have a block shape on the whole. The lead screw 122 may penetrate the slider 123. The slider 123 may include female threads formed on an inner side thereof, and the female threads may be engaged with the male threads of the lead screw 122. The slider 123 may be referred to as a lead nut. A protruding portion 123*a* may protrude from a lateral side of the slider 123, and may be fixed to a body 110 to be described later.

The rear holder 122*a* may be located between the driven pulley 121*c* and the slider 123, and may be adjacent to the driven pulley 121*c*. The rear holder 122*a* may be fixed to an inner side of the first side wall 12R, and the lead screw 122 may be rotatably coupled to the rear holder 122*a*. The front holder 122*b* may be located opposite the rear holder 122*a* with respect to the slider 123, and may be adjacent to the front end of the lead screw 122. The front holder 122*b* may be fixed to an inner side of the first side wall 12R, and the lead screw 122 may be rotatably coupled to the front holder 122*b*.

Accordingly, when the motor 121 is driven, the slider 123 may perform linear reciprocating motion along the lead screw 122. When the rotation shaft of the motor 121 rotates in a first rotational direction, the slider 123 may move forwardly along the lead screw 122. When the rotation shaft of the motor 121 rotates in a second rotational direction opposite the first rotational direction, the slider 123 may move backwardly along the lead screw 122. The above-described rear holder 122*a* may restrict the backward movement of the slider 123, and the above-described front holder 122*b* may restrict the forward movement of the slider 123.

Referring to FIGS. 5 and 6, a first frame 120Fa may be located on the left side of the lead screw 122, and may extend along the lead screw 122. The first frame 120Fa may form the right side of the housing 13. Here, the housing 13 may include a top part 13T, a rear part 13R, and a bottom part 13B, and the first frame 120Fa may be referred to as a right part 120Fa of the housing 13. The first frame 120Fa may be located between the top part 13T and the rear part 13R, and may be coupled to the top part 13T and the rear part 13R. This housing 13 may include an open front side.

A slot 120FS may be formed so as to penetrate the first frame 120Fa in the leftward-rightward direction, and may be formed to be elongated in the forward-backward direction. The protruding portion 123*a* of the slider 123 may pass through the slot 120FS, and may be fixed to a right side 110R of the body 110 located in the housing 13. The slot 120FS may restrict rotation of the protruding portion 123*a* of the lead screw 122.

A rail 120FR may be coupled to a left side of the first frame 120Fa, and may extend long in the forward-backward direction. The rail 120FR may be spaced upward or downward from the slot 120FS.

Carriages 110S1 and 110S2 may be fixed to the right side 110R of the body 110, and may be coupled to the rail 120FR so as to be movable in the forward-backward direction. For example, the carriages 110S1 and 110S2 may include a first carriage 110S1 and a second carriage 110S2, which are located opposite each other with respect to the protruding portion 123*a* of the slider 123.

Accordingly, when the motor 121 is driven, the body 110 fixed to the slider 123 may perform linear reciprocating motion along the rail 120FR. In other words, the body 110 may move forwardly and backwardly in the housing 13.

Meanwhile, a pin indicator 123*b* may be formed on the lower surface of the slider 123. A rear sensor 124*a* may be adjacent to the rear holder 122*a*, and a front sensor 124*b* may be adjacent to the front holder 122*b*. The sensors 124*a* and 124*b* may be photosensors. That is, the sensors 124*a* and 124*b* may detect approach of the pin indicator 123*b*.

Accordingly, a controller of the display device may determine whether the body 110 has moved backwardly or forwardly to the maximum extent with respect to the housing 13 based on information obtained from the rear sensor 124*a* or the front sensor 124*b*.

Referring to FIGS. 3 and 7, the second side wall 12L may be open in a direction toward the first side wall 12R, i.e., to the right. The second sliding assembly 120*b* may be mounted in an inner space in the second side wall 12L.

For example, the second sliding assembly 120*b* may be symmetrical to the first sliding assembly 120*a* described above with reference to FIGS. 4 to 6. In this case, the above description of the first sliding assembly 120*a* may be identically applied to the second sliding assembly 120*b*.

Meanwhile, a second frame 120Fb may be located on the left side of the lead screw 122, and may extend along the lead screw 122. The second frame 120Fb may form the left side of the housing 13. Here, the housing 13 may include a top part 13T, a rear part 13R, and a bottom part 13B, and the second frame 120Fb may be referred to as a left part 120Fb of the housing 13. The second frame 120Fb may be located between the top part 13T and the rear part 13R, and may be coupled to the top part 13T and the rear part 13R. This housing 13 may include an open front side.

In addition, the first sliding assembly 120*a* may be located opposite the right side 110R of the body 110 with respect to the first frame 120Fa, and may be coupled to the right side 110R. The second sliding assembly 120*b* may be located opposite the left side 110L of the body 110 with respect to the second frame 120Fb, and may be coupled to the left side 110L.

Accordingly, when the motor 121 of the first sliding assembly 120*a* and the motor 121 of the second sliding assembly 120*b* are driven, the body 110 may perform linear reciprocating motion due to power transmitted to the left and right sides of the body 110.

Referring to FIGS. 8 and 9, the body 110 may extend long in the leftward-rightward direction. The body 110 may have a substantially flat box shape.

A plurality of displays 130, 140, and 150 may be located in front of the body 110, and may be coupled to the body 110.

A first display 130 may be disposed at the center of the body 110. A second display 140 may be disposed on the left side of the first display 130. A third display 150 may be disposed on the right side of the first display 130. A portion of the body 110 to which the first display 130 is coupled may be referred to as a first part 113. A portion of the body 110 to which the second display 140 is coupled may be referred to as a second part 114, A portion of the body 110 to which the third display 150 is coupled may be referred to as a third part 115.

For example, the first display 130 may be a CID, the second display 140 may be a CDD, and the third display 150 may be a cluster.

The shapes, positions, or angles of these plurality of displays 130, 140, and 150 may be varied depending on the forward/backward movement of the body 110. That is, when the body 110 moves backwardly, the screens of the plurality of displays 130, 140, and 150 may be folded or hidden, and when the body 110 moves forwardly, the screens of the plurality of displays 130, 140, and 150 may be unfolded or deployed.

Referring to FIGS. 10 and 11, the first display 130 may be located in front of the first part 113, and may be coupled to a front end 113*a* of the first part 113. The first display 130 may include a folding module and a first display panel 136. The folding module may include a first bracket 131, 132, and 133, an upper drive unit 132*a*, 132*b*, and 132*c*, a lower drive unit 133*a*, 133*b*, and 133*c*, an upper plate 134, and a lower plate 135. The first display 130 may be a foldable display.

The first bracket 131, 132, and 133 may have a substantially square bracket shape. The first bracket 131, 132, and 133 may include a vertical portion 131, a first horizontal portion 132, and a second horizontal portion 133. The vertical portion 131 may extend in the longitudinal direction of the first part 113, the thickness of the vertical portion 131 may be defined in the forward-backward direction, and the width of the vertical portion 131 may be defined in the upward-downward direction. The first horizontal portion 132 may be bent and extend forwardly from the upper end of the vertical portion 131, and the thickness of the first horizontal portion 132 may be defined in the upward-downward direction. The second horizontal portion 133 may be bent and extend forwardly from the lower end of the vertical portion 131, and the thickness of the second horizontal portion 133 may be defined in the upward-downward direction.

A first coupling portion 131a may protrude from the rear surface of the vertical portion 131 to the front end 113a of the first part 113, and may be rotatably coupled to the front end 113a. The rotation axis of the first coupling portion 131a may be parallel to the leftward-rightward direction.

The upper drive unit 132a, 132b, and 132c may include an upper motor (not numbered), an upper drive pulley 132a, an upper driven pulley 132c, and an upper belt 132b.

The upper motor may be mounted inside the first horizontal portion 132, and may provide rotational force. The upper motor may be an electric motor configured to be adjustable in rotational direction, rotational angle, and rotational speed, and may include a rotation shaft parallel to the leftward-rightward direction.

The upper drive pulley 132a may be orthogonal to the rotation shaft of the upper motor, may be fixed to the rotation shaft, and may be spaced apart from the upper driven pulley 132c. The upper belt 132b may be engaged with the upper drive pulley 132a and the upper driven pulley 132c, and may be referred to as a timing belt. Accordingly, the upper belt 132b may transmit rotation of the upper drive pulley 132a to the upper driven pulley 132c.

The lower drive unit 133a, 133b, and 133c may include a lower motor (not numbered), a lower drive pulley 133a, a lower driven pulley 133c, and a lower belt 133b.

The lower motor may be mounted inside the second horizontal portion 133, and may provide rotational force. The lower motor may be an electric motor configured to be adjustable in rotational direction, rotational angle, and rotational speed, and may include a rotation shaft parallel to the leftward-rightward direction.

The lower drive pulley 133a may be orthogonal to the rotation shaft of the lower motor, may be fixed to the rotation shaft, and may be spaced apart from the lower driven pulley 133c. The lower belt 133b may be engaged with the lower drive pulley 133a and the lower driven pulley 133c, and may be referred to as a timing belt. Accordingly, the lower belt 133b may transmit rotation of the lower drive pulley 133a to the lower driven pulley 133c.

The upper plate 134 may be located in front of the first horizontal portion 132. An upper knuckle 134n may be formed on one side of the upper plate 134 that is adjacent to the first horizontal portion 132. An upper pin (not shown) may extend in the rotation-axis direction of the upper driven pulley 132c, may penetrate the upper knuckle 134n, and may be fixed to the upper knuckle 134n. In addition, one end of the upper pin may be fixed to the upper driven pulley 132c, and the other end of the upper pin may be rotatably coupled to an upper holder (not shown) fixed to an inner side of the first horizontal portion 132.

Accordingly, the upper plate 134 may be hinged to the first horizontal portion 132, and may perform hinge motion in response to operation of the upper motor. The hinge axis of the upper plate 134 may be parallel to the leftward-rightward direction. In an example shown in FIG. 10, an angle between the upper plate 134 and the first horizontal portion 132 may be 180 degrees. In an example shown in FIG. 11, the upper plate 134 may rotate from the first horizontal portion 132 in the clockwise direction, and an angle between the upper plate 134 and the first horizontal portion 132 may be 90 degrees.

The lower plate 135 may be located in front of the second horizontal portion 133. A lower knuckle 135n may be formed on one side of the lower plate 135 that is adjacent to the second horizontal portion 133. A lower pin (not shown) may extend in the rotation-axis direction of the lower driven pulley 133c, may penetrate the lower knuckle 135n, and may be fixed to the lower knuckle 135n. In addition, one end of the lower pin may be fixed to the lower driven pulley 133c, and the other end of the lower pin may be rotatably coupled to a lower holder 133d fixed to an inner side of the second horizontal portion 133.

Accordingly, the lower plate 135 may be hinged to the second horizontal portion 133, and may perform hinge motion in response to operation of the lower motor. The hinge axis of the lower plate 135 may be parallel to the leftward-rightward direction. In an example shown in FIG. 10, an angle between the lower plate 135 and the second horizontal portion 133 may be 180 degrees. In an example shown in FIG. 11, the lower plate 135 may rotate from the second horizontal portion 133 in the counterclockwise direction, and an angle between the lower plate 135 and the second horizontal portion 133 may be 90 degrees.

The first display panel 136 may be located opposite the first bracket 131, 132, and 133 with respect to the upper plate 134 and the lower plate 135. The first display panel 136 may be coupled to the upper plate 134 and the lower plate 135. One end of the first display panel 136 may be coupled to an inner side of the upper plate 134, and the other end of the first display panel 136 may be coupled to an inner side of the lower plate 135.

In addition, the first display panel 136 may be a flexible display panel. For example, the first display panel 136 may be an organic light-emitting diode (OLED) panel or plastic OLED (POLED) panel. Accordingly, the first display panel 136 may be bent.

In an example shown in FIG. 10, the first part 113 of the body 110 may be adjacent to the rear end of the housing 13 in the housing 13. In this case, the upper plate 134 and the lower plate 135 may oppose each other in the upward-downward direction, and the first display panel 136 may be bent so as to be convex backward.

In an example shown in FIG. 11, the first part 113 of the body 110 may be adjacent to the front end of the housing 13 in the housing 13. In this case, a direction perpendicular to the upper plate 134 and a direction perpendicular to the lower plate 135 may be oriented forward, and the first display panel 136 may be unfolded to be flat.

Meanwhile, the door 162 may form the lower surface of the display device, and may be shifted up and down with respect to the housing 13 (refer to "SH" in FIG. 11). That is, in response to forward movement of the body 110 and the first display 130, the door 162 may be shifted down with respect to the housing 13, thereby increasing the inner space in the display device. Alternatively, in response to backward movement of the body 110 and the first display 130, the door 162 may be shifted up with respect to the housing 13, thereby reducing the inner space in the display device.

Referring to FIG. 12, supporters 137 and 138 may be spaced leftward and/or rightward from the drive units 132a, 132b, 132c, 133a, 133b, and 133c described above with reference to FIGS. 10 and 11.

An upper supporter 137 may be provided on one side of the upper plate 134 that is adjacent to the first horizontal portion 132, and may be rotatably coupled to the upper holder (not shown) fixed to an inner side of the first horizontal portion 132. The rotation axis of the upper supporter 137 may be parallel to the rotation axis of the upper driven pulley 132c (refer to FIGS. 10 and 11). An upper arm 137a, which is a part of the upper supporter 137, may extend in the radial direction of the upper supporter 137.

This upper arm 137a may overlap the inner side of the first horizontal portion 132 in the rotational direction of the upper supporter 137. In other words, when the upper arm 137*a* comes into contact with the inner side of the first horizontal portion 132, rotation of the upper plate 134 in the counterclockwise direction may be restricted.

A lower supporter 138 may be provided on one side of the lower plate 135 that is adjacent to the second horizontal portion 133, and may be rotatably coupled to a lower holder 133*e* fixed to an inner side of the second horizontal portion 133. The rotation axis of the lower supporter 138 may be parallel to the rotation axis of the lower driven pulley 133*c* (refer to FIGS. 10 and 11). A lower arm 138*a*, which is a part of the lower supporter 138, may extend in the radial direction of the lower supporter 138.

This lower arm 138*a* may overlap the inner side of the second horizontal portion 133 in the rotational direction of the lower supporter 138. In other words, when the lower arm 138*a* comes into contact with the inner side of the second horizontal portion 133, rotation of the lower plate 135 in the clockwise direction may be restricted.

In addition, the upper arm 137*a* and the lower arm 138*a* may come into contact with or become adjacent to each other in response to hinge motion of the upper plate 134 and the lower plate 135 (refer to dotted lines and solid-line arrows in FIG. 12). In this case, the upper arm 137*a* and the lower arm 138*a* may support the rear surface of the first display panel 136.

Meanwhile, a portion 134*a* of the upper plate 134 may cover an upper side of the first display panel 136, and a portion 135*a* of the lower plate 135 may cover a lower side of the first display panel 136. Further, left and right sides of the first display panel 136 may also be covered by the upper plate 134 and the lower plate 135.

Referring to FIG. 13, a tilting module 139*a*, 139*b*, and 139*c* may be mounted inside the second part 114 of the body 110. The tilting module 139*a*, 139*b*, and 139*c* may include a tilting motor (not numbered), a drive pulley 139*a*, a driven pulley 139*c*, and a belt 139*b*.

The tilting motor may be mounted inside the second part 114, and may provide rotational force. The tilting motor may be an electric motor configured to be adjustable in rotational direction, rotational angle, and rotational speed, and may include a rotation shaft parallel to the leftward-rightward direction.

The drive pulley 139*a* may be orthogonal to the rotation shaft of the tilting motor, may be fixed to the rotation shaft, and may be spaced apart from the driven pulley 139*c*. The belt 139*b* may be engaged with the drive pulley 139*a* and the driven pulley 139*c*, and may be referred to as a timing belt. Accordingly, the belt 139*b* may transmit rotation of the drive pulley 139*a* to the driven pulley 193*c*.

This driven pulley 139*c* may be axially coupled to the first coupling portion 131*a* (refer to FIG. 11). That is, the rotation shaft of the first coupling portion 131*a* may be coaxial with the rotation axis of the driven pulley 139*c*.

Accordingly, when the tilting motor is driven, the first display 130 may be tilted up and down (refer to "tilt" in FIG. 13). For example, the first display 130 may be tilted up and down in the range of about 10 degrees. Meanwhile, in some embodiments, the tilting module 139*a*, 139*b*, and 139*c* may be mounted inside the first part 113 or the third part 115.

Referring to FIGS. 14 to 16, the second display 140 may be coupled to a front end of the second part 114. The second display 140 may include a swing module and a second display panel 146. The swing module may include a second bracket 141, a drive unit 142*a*, 142*b*, and 142*c*, a holder 143, and a plate 145. The second display 140 may be referred to as a swing display or a rotatable display.

The second bracket 141 may extend in the leftward-rightward direction. The second bracket 141 may be located in a groove 114*g* in the second part 114, and may be rotatably coupled to the second part 114.

Here, the groove 114*g* may be formed in the front end of the second part 114 so as to be depressed backward, and may be open downward. A first surface 114*g*1 may define the rear boundary of the groove 114*g*, and a second surface 114*g*2 may define the upper boundary of the groove 114*g*. The first surface 114*g*1 and the second surface 114*g*2 may intersect each other. For example, an angle between the first surface 114*g*1 and the second surface 114*g*2 may be 90 degrees or an obtuse angle.

The drive unit 142*a*, 142*b*, and 142*c* may be located on the left side of the second bracket 141. The drive unit 142*a*, 142*b*, and 142*c* may be located in a portion of the second part 114 that is located on the left side of the groove 114*g*. The drive unit 142*a*, 142*b*, and 142*c* may include a swing motor (not numbered), a drive pulley 142*a*, a driven pulley 142*c*, and a belt 142*b*.

The swing motor may be mounted inside the second part 114, and may provide rotational force. The swing motor may be an electric motor configured to be adjustable in rotational direction, rotational angle, and rotational speed, and may include a rotation shaft parallel to the leftward-rightward direction.

The drive pulley 142*a* may be orthogonal to the rotation shaft of the swing motor, may be fixed to the rotation shaft, and may be spaced apart from the driven pulley 142*c*. The belt 142*b* may be engaged with the drive pulley 142*a* and the driven pulley 142*c*, and may be referred to as a timing belt. Accordingly, the belt 142*b* may transmit rotation of the drive pulley 142*a* to the driven pulley 142*c*.

The holder 143 may be located on the right side of the second bracket 141. The holder 143 may be a portion of the second part 114 that is located on the right side of the groove 114*g*. The holder 143 may be located opposite the drive unit 142*a*, 142*b*, and 142*c* with respect to the second bracket 141.

The above-described second bracket 141 may be located between the driven pulley 142*c* and the holder 143, and may be axially coupled to the driven pulley 142*c* and the holder 143. That is, a shaft 141*a* of the second bracket 141 may extend long in the leftward-rightward direction. One end of the shaft 141*a* may be fixed to the driven pulley 142*c*, and the other end of the shaft 141*a* may be rotatably coupled to the holder 143.

Accordingly, the second bracket 141 may be rotatably coupled to the second part 114 of the body 110, and may perform swing motion in response to operation of the swing motor. The shaft 141*a* may provide a swing axis of the second bracket 141 parallel to the leftward-rightward direction. The second bracket 141 may rotate between the first surface 114*g*1 and the second surface 114*g*2. In other words, when the second bracket 141 comes into contact with the first surface 114*g*1, rotation of the second bracket 141 in the counterclockwise direction may be restricted, and when the second bracket 141 comes into contact with the second surface 114*g*2, rotation of the second bracket 141 in the clockwise direction may be restricted.

The plate 145 may be located opposite the second part 114 with respect to the second bracket 141. The second bracket 141 may protrude from the plate 145 in a direction intersecting the plate 145. The second bracket 141 may connect the plate 145 to the second part 114.

The second display panel 146 may be located opposite the second bracket 141 with respect to the plate 145. The second display panel 146 may be coupled to the plate 145. Portions

145*a* and 145*b* of the plate 145 may cover the lateral side of the second display panel 146. For example, the second display panel 146 may be an organic light-emitting diode (OLED) panel or plastic OLED (POLED) panel. In another example, the second display panel 146 may be a liquid crystal display (LCD) panel.

In an example shown in FIG. 14, the second part 114 of the body 110 may be adjacent to the rear end of the housing 13 in the housing 13. In this case, the second bracket 141 may protrude downward beyond the second part 114, and may be in contact with the first surface 114*g*1. In addition, the second display panel 146 may be located below the second part 114, and may be parallel to the second part 114.

In an example shown in FIG. 15, the second part 114 of the body 110 may be adjacent to the front end of the housing 13 in the housing 13. In this case, the second bracket 141 may protrude forward beyond the second part 114, and may be in contact with the second surface 114*g*2. In addition, the second display panel 146 may be located in front of the second part 114, and may be orthogonal to the second part 114.

Meanwhile, the door 162 may form the lower surface of the display device, and may be shifted up and down with respect to the housing 13 (refer to "SH" in FIG. 15). That is, in response to forward movement of the body 110 and the second display 140, the door 162 may be shifted down with respect to the housing 13, thereby increasing the inner space in the display device. Alternatively, in response to backward movement of the body 110 and the second display 140, the door 162 may be shifted up with respect to the housing 13, thereby reducing the inner space in the display device.

Referring again to FIGS. 15 and 16, the second display 140 may be located in front of the second part 114 of the body 110, and may be tilted up and down in response to operation of the swing motor (refer to "tilt" in FIG. 16). For example, the second display 140 may be tilted up and down in the range of about 10 degrees. The swing motor may be referred to as a tilting motor.

Referring to FIGS. 17 to 19, the third display 150 may be coupled to a front end of the third part 115. The third display 150 may include a swing module and a third display panel 156. The swing module may include a third bracket 151, a drive unit 152*a*, 152*b*, and 152*c*, a holder 153, and a plate 155. The third display 140 may be referred to as a swing display or a rotatable display.

The third bracket 151 may extend in the leftward-rightward direction. The third bracket 151 may be located in a groove 115*g* in the third part 115, and may be rotatably coupled to the third part 115.

Here, the groove 115*g* may be formed in the front end of the third part 115 so as to be depressed backward, and may be open downward. A first surface 115*g*1 may define the rear boundary of the groove 115*g*, and a second surface 115*g*2 may define the upper boundary of the groove 115*g*. The first surface 115*g*1 and the second surface 115*g*2 may intersect each other. For example, an angle between the first surface 115*g*1 and the second surface 115*g*2 may be 90 degrees or an obtuse angle.

The drive unit 152*a*, 152*b*, and 152*c* may be located on the left side of the third bracket 151. The drive unit 152*a*, 152*b*, and 152*c* may be located in a portion of the third part 115 that is located on the left side of the groove 115*g*. The drive unit 152*a*, 152*b*, and 152*c* may include a swing motor (not numbered), a drive pulley 152*a*, a driven pulley 152*c*, and a belt 152*b*.

The swing motor may be mounted inside the fifth part 115, and may provide rotational force. The swing motor may be an electric motor configured to be adjustable in rotational direction, rotational angle, and rotational speed, and may include a rotation shaft parallel to the leftward-rightward direction.

The drive pulley 152*a* may be orthogonal to the rotation shaft of the swing motor, may be fixed to the rotation shaft, and may be spaced apart from the driven pulley 152*c*. The belt 152*b* may be engaged with the drive pulley 152*a* and the driven pulley 152*c*, and may be referred to as a timing belt. Accordingly, the belt 152*b* may transmit rotation of the drive pulley 152*a* to the driven pulley 152*c*.

The holder 153 may be located on the right side of the third bracket 151. The holder 153 may be a portion of the third part 115 that is located on the right side of the groove 115*g*. The holder 153 may be located opposite the drive unit 152*a*, 152*b*, and 152*c* with respect to the third bracket 151.

The above-described third bracket 151 may be located between the driven pulley 152*c* and the holder 153, and may be axially coupled to the driven pulley 152*c* and the holder 153. That is, a shaft 151*a* of the third bracket 151 may extend long in the leftward-rightward direction. One end of the shaft 151*a* may be fixed to the driven pulley 152*c*, and the other end of the shaft 151*a* may be rotatably coupled to the holder 153.

Accordingly, the third bracket 151 may be rotatably coupled to the third part 115 of the body 110, and may perform swing motion in response to operation of the swing motor. The shaft 151*a* may provide a swing axis of the third bracket 151 parallel to the leftward-rightward direction. The third bracket 151 may rotate between the first surface 115*g*1 and the second surface 115*g*2. In other words, when the third bracket 151 comes into contact with the first surface 115*g*1, rotation of the third bracket 151 in the counterclockwise direction may be restricted, and when the third bracket 151 comes into contact with the second surface 115*g*2, rotation of the third bracket 151 in the clockwise direction may be restricted.

The plate 155 may be located opposite the third part 115 with respect to the third bracket 151. The third bracket 151 may protrude from the plate 155 in a direction intersecting the plate 155. The third bracket 151 may connect the plate 155 to the third part 115.

The third display panel 156 may be located opposite the third bracket 151 with respect to the plate 155. The third display panel 156 may be coupled to the plate 155. Portions 155*a* and 155*b* of the plate 155 may cover the lateral side of the third display panel 156. For example, the third display panel 156 may be an organic light-emitting diode (OLED) panel or plastic OLED (POLED) panel. In another example, the third display panel 156 may be a liquid crystal display (LCD) panel.

In an example shown in FIG. 17, the third part 115 of the body 110 may be adjacent to the rear end of the housing 13 in the housing 13. In this case, the third bracket 151 may protrude downward beyond the third part 115, and may be in contact with the first surface 115*g*1. In addition, the third display panel 156 may be located below the third part 115, and may be parallel to the third part 115.

In an example shown in FIG. 18, the third part 115 of the body 110 may be adjacent to the front end of the housing 13 in the housing 13. In this case, the third bracket 151 may protrude forward beyond the third part 115, and may be in contact with the second surface 115*g*2. In addition, the third display panel 156 may be located in front of the third part 115, and may be orthogonal to the third part 115.

Meanwhile, the door 162 may form the lower surface of the display device, and may be shifted up and down with respect to the housing 13 (refer to "SH" in FIG. 18). That is, in response to forward movement of the body 110 and the third display 150, the door 162 may be shifted down with respect to the housing 13, thereby increasing the inner space in the display device. Alternatively, in response to backward movement of the body 110 and the third display 150, the door 162 may be shifted up with respect to the housing 13, thereby reducing the inner space in the display device.

Referring again to FIGS. 18 and 19, the third display 150 may be located in front of the third part 115 of the body 110, and may be tilted up and down in response to operation of the swing motor (refer to "tilt" in FIG. 19). For example, the third display 150 may be tilted up and down in the range of about 10 degrees. The swing motor may be referred to as a tilting motor.

Referring to FIGS. 20 and 21, the door assembly 160 may include a base 161, a door 162, and a flap 163.

The base 161 may form a portion of the lower surface of the display device. The base 161 may be coupled to a lower side of the bottom part 13B of the housing 13 (refer to FIGS. 11, 15, and 18). The base 161 may extend long in the leftward-rightward direction.

The door 162 may form a portion of the lower surface of the display device. The door 162 may extend in the longitudinal direction of the base 161. The door 162 may be located in front of the base 161, and may be rotatably or pivotably coupled to the base 161. The door 162 may be inclined upward with respect to the base 161. For example, an angle Ga between the door 162 and the base 161 may be an acute angle.

The flap 163 may form a portion of the front surface of the display device. The flap 163 may extend in the longitudinal direction of the door 162. The flap 163 may intersect the door 162, and may be rotatably coupled to the front end of the door 162.

A pivot assembly 164, 164*a*, 165, 166, 167, 167*a*, 168, and 169 may include pivot motors 164, 164*a*, 167, and 167*a* and pivot arms 165, 166, 168, and 169.

The pivot motors 164, 164*a*, 167, and 167*a* may be mounted on the base 161, and may provide rotational force. The pivot motors 164, 164*a*, 167, and 167*a* may be electric motors configured to be adjustable in rotational direction, rotational angle, and rotational speed, and may include a rotation shaft parallel to the leftward-rightward direction.

A first pivot arm 165 and a second pivot arm 166 may be located on the door 162, and may be adjacent to the left side of the door 162. A third pivot arm 168 and a fourth pivot arm 169 may be located on the door 162, and may be adjacent to the right side of the door 162. For example, the pivot arms 165, 166, 168, and 169 may have the same shape. For example, each of the pivot arms 165, 166, 168, and 169 may have a rifle shape on the whole.

The first pivot arm 165 may include a first pivot point 165*a*, a first middle point 165*b*, and a first top point 165*c*, which are spaced apart from one another. The first pivot point 165*a* may be adjacent to the rear end of the first pivot arm 165, and may be located on the base 161. The first middle point 165*b* may be adjacent to the center portion of the first pivot arm 165, may be located on the door 162, and may be adjacent to the boundary between the door 162 and the base 161. The first top point 165*c* may be adjacent to the front end of the first pivot arm 165, may be located on the door 162, and may be spaced apart from the first middle point 165*b* in the width direction of the door 162.

A first pivot motor 164 may be mounted on the base 161, and may be adjacent to the first pivot arm 165. The rotation shaft of the first pivot motor 164 may be fixed to the first pivot point 165*a*. That is, the pivot axis of the first pivot arm 165 may be coaxial with the rotation shaft of the first pivot motor 164, and may be parallel to the leftward-rightward direction.

A first coupling portion 1621 may protrude upward from the upper surface of the door 162, and the first middle point 165*b* and the first top point 165*c* of the first pivot arm 165 may be coupled or fixed to the first coupling portion 1621.

The second pivot arm 166 may be located closer to the left side of the door 162 than the first pivot arm 165. The second pivot arm 166 may have the same shape as the first pivot arm 165. A second pivot point 166*a* of the second pivot arm 166 may be aligned with the first pivot point 165*a* of the first pivot arm 165 in the leftward-rightward direction.

A second pivot motor 164*a* may be mounted on the base 161, and may be adjacent to the second pivot arm 166. The rotation shaft of the second pivot motor 164*a* may be fixed to the second pivot point 166*a*. That is, the pivot axis of the second pivot arm 166 may be coaxial with the rotation shaft of the second pivot motor 164*a*, and may be parallel to the leftward-rightward direction.

A second coupling portion 1622 may protrude upward from the upper surface of the door 162, and a second middle point (not shown) and a second top point (not shown) of the second pivot arm 166 may be coupled or fixed to the second coupling portion 1622.

The third pivot arm 168 may include a third pivot point 168*a*, a third middle point 168*b*, and a third top point 168*c*, which are spaced apart from one another. The third pivot point 168*a* may be adjacent to the rear end of the third pivot arm 168, and may be located on the base 161. The third middle point 168*b* may be adjacent to the center portion of the third pivot arm 168, may be located on the door 162, and may be adjacent to the boundary between the door 162 and the base 161. The third top point 168*c* may be adjacent to the front end of the third pivot arm 168, may be located on the door 162, and may be spaced apart from the third middle point 168*b* in the width direction of the door 162.

A third pivot motor 167 may be mounted on the base 161, and may be adjacent to the third pivot arm 168. The rotation shaft of the third pivot motor 167 may be fixed to the third pivot point 168*a*. That is, the pivot axis of the third pivot arm 168 may be coaxial with the rotation shaft of the third pivot motor 167, and may be parallel to the leftward-rightward direction.

A third coupling portion 1623 may protrude upward from the upper surface of the door 162, and the third middle point 168*b* and the third top point 168*c* of the third pivot arm 168 may be coupled or fixed to the third coupling portion 1623.

The fourth pivot arm 169 may be located closer to the right side of the door 162 than the third pivot arm 168. The fourth pivot arm 169 may have the same shape as the third pivot arm 168. A fourth pivot point 169*a* of the fourth pivot arm 169 may be aligned with the third pivot point 168*a* of the third pivot arm 168 in the leftward-rightward direction. In addition, the first pivot points 165*a*, 166*a*, 168*a*, and 169*a* may be aligned with each other in the leftward-rightward direction.

A fourth pivot motor 167*a* may be mounted on the base 161, and may be adjacent to the fourth pivot arm 169. The rotation shaft of the fourth pivot motor 167*a* may be fixed to the fourth pivot point 169*a*. That is, the pivot axis of the fourth pivot arm 169 may be coaxial with the rotation shaft of the fourth pivot motor 167*a*, and may be parallel to the leftward-rightward direction.

A fourth coupling portion 1624 may protrude upward from the upper surface of the door 162, and a fourth middle point (not shown) and a fourth top point (not shown) of the fourth pivot arm 169 may be coupled or fixed to the fourth coupling portion 1624.

Accordingly, when the pivot motors 164, 164*a*, 167, and 167*a* are driven, the door 162 may pivot about the pivot axes of the pivot arms 165, 166, 168, and 169. That is, the door 162 may be shifted up and down with respect to the base 161 (refer to "SH" in FIG. 21).

The above-described flap 163 may be hinged to the front end of the door 162 at a plurality of points 163*a*, 163*b*, 163*c*, and 163*d*. The hinge axis Ax of the flap 163 may be parallel to the leftward-rightward direction.

A link assembly 170 and 180 may connect the upper side of the door 162 to the inner side of the flap 163. For example, the link assembly 170 and 180 may include a first link assembly 170 and a second link assembly 180, which are spaced apart from each other in the leftward-rightward direction. In another example, the link assembly 170 and 180 may include one or three or more link assemblies. Hereinafter, for the sake of brief description, the present disclosure will be described in conjunction with a case in which the link assembly 170 and 180 includes the first link assembly 170 and the second link assembly 180.

The first link assembly 170 may include a link motor 171, a first link arm 172, and a second link arm 173.

The link motor 171 may be mounted on the door 162, and may provide rotational force. The link motor 171 may be an electric motor configured to be adjustable in rotational direction, rotational angle, and rotational speed, and may include a rotation shaft parallel to the leftward-rightward direction.

One end 172*a* of the first link arm 172 may be fixed to the rotation shaft of the link motor 171. One end 173*a* of the second link arm 173 may be rotatably connected to the other end of the first link arm 172. The other end 173*b* of the second link arm 173 may be rotatably connected to an inner side of the flap 163.

The second link assembly 180 may include a link motor 181, a first link arm 182, and a second link arm 183.

The link motor 181 may be mounted on the door 162, and may provide rotational force. The link motor 181 may be an electric motor configured to be adjustable in rotational direction, rotational angle, and rotational speed, and may include a rotation shaft parallel to the leftward-rightward direction.

One end 182*a* of the first link arm 182 may be fixed to the rotation shaft of the link motor 181. One end 183*a* of the second link arm 183 may be rotatably connected to the other end of the first link arm 182. The other end 183*b* of the second arm 183 may be rotatably connected to an inner side of the flap 163.

Accordingly, when the link motors 171 and 181 are driven, the link arms 172, 173, 182, and 183 may be folded or unfolded.

For example, when the rotation shafts of the link motors 171 and 181 rotate in the counterclockwise direction, the first link arms 172 and 182 may be reclined backward, and the link arms 172, 173, 182, and 183 may be folded. In this case, the flap 163 may be reclined while performing hinge motion in the counterclockwise direction from the door 162.

For example, when the rotation shafts of the link motors 171 and 181 rotate in the clockwise direction, the first link arms 172 and 183 may be erected forward, and the link arms 172, 173, 182, and 183 may be unfolded. In this case, the flap 163 may be erected while performing hinge motion in the clockwise direction from the door 162.

Referring to FIGS. 22 and 23, each of the pivot arms 165, 166, 168, and 169 may have a knife shape on the whole. Each of the pivot arms 165, 166, 168, and 169 having such a shape may include points such as the third pivot point 168*a* and the third middle points 168*b* and 168*c* described above.

Referring to FIGS. 22 and 24, the door assembly may include one link assembly 170. That is, the flap 163 may be reclined backward (refer to FIG. 24) or erected forward in response to the folding motion of the link assembly 170.

Referring to FIG. 25, as described above with reference to FIGS. 11, 15, and 18, in response to forward movement of the body 110 and the displays 130, 140, and 150, the door 162 may be shifted down with respect to the base 161 (refer to "SH"), and may deviate from the movement paths of the body 110 and the displays 130, 140, and 150. In addition, in response to forward movement of the body 110 and the displays 130, 140, and 150, the flap 163 may be reclined backward (refer to "RH"), and may expose the front sides of the body 110 and the displays 130, 140, and 150.

Referring to FIG. 26, the door 162 may be shifted down. In this case, the flap 163 may be reclined to the inside of the display device.

Alternatively, the door 162 may be shifted up. In this case, the flap 163 may be erected to cover the inside of the display device.

Referring to FIG. 27, in the state in which the door 162 is shifted down, the first display 130, the second display 140, and the third display 150 may move forward from the inside of the display device. In this case, the first display panel 136 of the first display 130 may be made flat from a state of being convex backward, and the second display panel 146 of the second display 140 and the third display panel 156 of the third display 150 may swing so as to face forward from a state of facing downward. In addition, each of the first display 130, the second display 140, and the third display 150 may be tilted up and down (refer to "T1", "T2", and "T3").

Alternatively, in a state in which the door 162 is shifted down, the first display 130, the second display 140, and the third display 150 may move backward to the inside of the display device. In this case, the first display panel 136 of the first display 130 may be bent so as to be convex backward from the flat state, and the second display panel 146 of the second display 140 and the third display panel 156 of the third display 150 may swing so as to face downward from the state of facing forward.

Referring to FIGS. 28 and 29, a folding assembly 190 may connect the top part 13T of the housing 13 to the inner side of the top cover 19. For example, the folding assembly 190 may include a first folding assembly (not shown) located on the right side of the top cover 19 and a second folding assembly 190*b* located on the left side of the top cover 19. In another example, the folding assembly 190 may include one or three or more folding assemblies. Hereinafter, for the sake of brief description, the present disclosure will be described based on a case in which the folding assembly 190 includes the first folding assembly and the second folding assembly 190*b*. In addition, the first folding assembly and the second folding assembly 190*b* may be bilaterally symmetrical to each other, and the description of the second folding assembly 190*b* may be equally applied to the first folding assembly.

The second folding assembly 190*b* may include a folding motor (not shown), a drive pulley 191*a*, a driven pulley 191*c*, a belt 191*b*, a folding arm 192, and a connecting member 193.

The folding motor may be mounted on the top part 13T, and may provide rotational force. The folding motor may be an electric motor configured to be adjustable in rotational direction, rotational angle, and rotational speed, and may include a rotation shaft parallel to the leftward-rightward direction.

The drive pulley 191*a* may be orthogonal to the rotation shaft of the folding motor, may be fixed to the rotation shaft, and may be spaced apart from the driven pulley 191*c*. The belt 191*b* may be engaged with the drive pulley 191*a* and the driven pulley 191*c*, and may be referred to as a timing belt. Accordingly, the belt 191*b* may transmit rotation of the drive pulley 191*a* to the driven pulley 191*c*.

The folding arm 192 may extend long. One end 192*a* of the folding arm 192 may be fixed to the driven pulley 191*c*. The other end 192*b* of the folding arm 192 may be rotatably coupled to a portion of the top cover 19 that is adjacent to the rear end of a first cover 19*a*. The rotation axis Axa of the first cover 19*a* may be parallel to the leftward-rightward direction.

The connecting member 193 may be coupled to an inner side of a second cover 19*b* of the top cover 19. The second cover 19*b* may be located behind the first cover 19*a*. One end 193*a* of the connecting member 193 may be hinged to a portion of the first cover 19*a* between the other end 192*b* of the folding arm 192 and the rear end of the first cover 19*a*. The hinge axis Axb of one end 193*a* of the connecting member 193 may be parallel to the leftward-rightward direction. The other end 193*b* of the connecting member 193 may be hinged to a portion of the top part 13T in which the heat dissipation holes 10*a* are formed. The hinge axis Axc of the other end 193*b* of the connecting member 193 may be parallel to the leftward-rightward direction.

Accordingly, when the folding motor is driven, the folding arm 192 may be reclined or erected, and the top cover 19 may be unfolded or folded.

In an example shown in FIG. 28, the folding arm 192 may be reclined, and the top cover 19 may be unfolded. In this case, the top cover 19 may cover the upper surface of the top part 13T and a plurality of electronic components B1, B2, B3, and B4 mounted on the upper surface.

In an example shown in FIG. 29, the folding arm 192 may be erected, and the top cover 19 may be folded. In detail, the first cover 19*a* may perform hinge motion with the front end thereof moving downward and the rear end thereof moving upward, the second cover 19*b* may perform hinge motion with the front end thereof moving upward, and the first cover 19*a* and the second cover 19*b* may overlap each other. In this case, the top cover 19 may expose the upper surface of the top part 13T and the plurality of electronic components B1, B2, B3, and B4 mounted on the upper surface to the outside.

Referring to FIG. 30, a display device 200 for a vehicle may include a communication unit 210, an input unit 220, a memory 230, an interface unit 250, an output unit 260, a processor 270, and a power supply 290. The display device 200 for vehicles may be the display device 10 for the vehicle. The processor 270 may be referred to as a main controller 270 or a first controller 270.

The communication unit 210 may perform data communication with another device located inside or outside the vehicle. For example, the other device may include at least one of a terminal, a mobile terminal, a server, or another vehicle. The communication unit 210 may include at least one of a V2X communication module, an optical communication module, a position information module, or a short-range communication module.

The input unit 220 may receive various inputs for the display device 200 for the vehicle. The input unit 220 may receive a user input for the display device 200 for the vehicle. When an ON input for the display device 200 for the vehicle is received through the input unit 220, the display device 200 for the vehicle may operate.

The input unit 220 may be electrically connected to the processor 270. The input unit 220 may generate a signal corresponding to the received input, and may provide the signal to the processor 270. The processor 270 may control the display device 200 for the vehicle in response to the input for the display device 200 for the vehicle received through the input unit 220.

The input unit 220 may receive an activation input for various functions of the display device 200 for the vehicle. For example, the input unit 220 may receive a setting input for an output mode of the output unit 260.

The input unit 220 may include at least one of a mechanical type input device, a touch type input device, or a wireless input device. The mechanical type input device may include a button, a lever, a jog wheel, a switch, and the like. The touch type input device may include at least one touch sensor. The touch type input device may be implemented as a touchscreen.

In a case in which navigation is output to the touchscreen, when a touch input for a specific point of the navigation is received, the processor 270 may generate and output a travel route along which the vehicle travels to the specific point corresponding to the received touch input, or may control the vehicle so that the vehicle travels autonomously to the specific point. The wireless input device may receive a user input in a wireless manner.

The memory 230 may store a program for processing or control of the processor 270, various types of data on operation of the display device 200 for the vehicle, and at least one piece of content. The memory 230 may be electrically connected to the processor 270.

The processor 270 may allow various types of data on operation of the display device 200 for the vehicle to be stored in the memory 230. The processor 270 may output the content stored in the memory 230 to the output unit 260.

The interface unit 250 may serve as a channel between the display device 200 for the vehicle and an external device. The interface unit 250 may receive various signals or information from the outside, or may transmit signals or information provided by the processor 270 to the outside. The interface unit 250 may be connected to the processor 270, an input unit 320, a vehicle driving unit 350, a controller 370, a communication unit 310, and a sensing unit 325 to perform data communication. The controller 370 may be referred to as a sub-controller 370 or a second controller 370.

The interface unit 250 may provide driving information of the vehicle provided from at least one of the input unit 320, the vehicle driving unit 350, the controller 370, the communication unit 310, or the sensing unit 325 to the processor 270.

The driving information may include information on at least one of a position of the vehicle, a travel route, a speed, an autonomous travel state, a driving mode, a fuel amount, a charging amount, a vehicle type, a state of a driver, or a time. The driving mode may include an eco mode for travel based on fuel efficiency, a sport mode for sporty driving, and a normal mode.

The interface unit 250 may provide a signal provided by the processor 270 to the controller 370 or the vehicle driving unit 350. The signal provided to the controller 370 or the vehicle driving unit 350 may be a signal for control of the vehicle. The controller 370 may control the vehicle in response to a signal for control of the vehicle. The vehicle driving unit 350 may be driven in response to a signal for control of the vehicle.

The output unit 260 may include display units 130, 140, and 150 configured to output images and a sound output unit 262 configured to output sound. The above-described displays 130, 140, and 150 may be referred to as the display units 130, 140, and 150.

The display units 130, 140, and 150 may display various graphic objects. The display units 130, 140, and 150 may include a cluster that allows a driver to check vehicle travel information or vehicle state information. The cluster may be located on a dashboard. The driver may check information displayed on the cluster while looking forward.

The display units 130, 140, and 150 may be implemented as a head-up display (HUD). When the display units 130, 140, and 150 are implemented as a HUD, information may be output through a transparent display provided on a windshield. Alternatively, the display units 130, 140, and 150 may include a projection module to output information through an image projected on the windshield.

A transparent display may have certain transparency and may display a certain screen. The transparent display may include a transparent organic light-emitting diode (OLED) in order to have transparency. The transparency of the transparent display may be adjusted.

A touch input device included in the display units 130, 140, and 150 and the input unit 220 may have a mutual layer structure or may be formed in an integral type to implement a touchscreen. The touchscreen may function as the input unit 220 that provides an input interface between the display device 200 for the vehicle and a user, and may also provide an output interface between the display device 200 for the vehicle and the user.

The display units 130, 140, and 150 may include a touch sensor configured to detect a touch in order to receive a control command input in a touch manner. When a touch is performed on the display units 130, 140, and 150, the touch sensor may detect the touch, and the processor 270 may generate a control command corresponding to the touch based thereon. The content input in a touch manner may be a character or a number or may be an instruction in various modes or a menu item that can be designated.

The display units 130, 140, and 150 may be electrically connected to the processor 270 to be controlled by the processor 270. The processor 270 may output an image of content or a screen of navigation through the display units 130, 140, and 150. The navigation may be an application program for guiding a travel route of the vehicle, and may include a screen showing a travel route or a guidance voice.

The sound output unit 262 may output a sound corresponding to an electric signal provided by the processor 270. To this end, the sound output unit 262 may include a speaker or the like. The processor 270 may output a sound of content or a guidance voice of navigation through the sound output unit 262.

The processor 270 may control overall operation of each unit in the display device 200 for the vehicle. The processor 270 may be electrically connected to the communication unit 210, the input unit 220, the memory 230, the interface unit 250, the power supply 290, and the output unit 260.

In addition, the processor 270 may be electrically connected to the above-described drive module, and may control operation of the drive module. Here, the drive module may include the sliding assembly 120 (refer to FIGS. 4 to 7), the folding module of the first display 130 (refer to FIGS. 10 and 11), the tilting module 139*a*, 139*b*, and 139*c* of the first display 130 (refer to FIG. 13), the swing module of the second display 140 (refer to FIGS. 14 and 15), the swing module of the third display 150 (refer to FIGS. 17 and 18), the pivot assembly 164, 164*a*, 165, 166, 167, 167*a*, 168, and 169 (refer to FIGS. 20 to 24), the link assembly 170 and 180 (refer to FIGS. 21 to 24), and the folding assembly 190 (refer to FIG. 28).

Referring to FIGS. 1 to 30, a display device for the vehicle according to one aspect of the present disclosure may include: a housing with an open side; a sliding assembly located in the housing and including a slider which is movable away from or toward the opening; a body located in the housing and fixed to the slider; and a display coupled to the body, and which is movable out of the housing through the opening, the display may include: a display panel; and a swing module which is located between the display panel and the body, to which the display panel is coupled, and which is rotatably coupled to the body, and a rotation axis of the swing module may intersect a movement direction of the body.

The display panel may be located in the housing or may be located outside the housing through the opening of the housing according to a movement of the body.

When the display panel is located in the housing, the swing module may be rotated such that the display panel is parallel to the body, and when the display panel is located outside the housing, the swing module may be rotated such that the display panel intersects the body.

The swing module may include a plate to which the display panel is coupled, a bracket protruding from the plate toward the body and rotatably coupled to the body, and a drive unit coupled to the bracket and rotating the bracket about the rotation axis.

The swing module may further include a holder opposite the drive unit with respect to the bracket, and the bracket may further include a shaft extending along the rotation axis, and including one end connected to the drive unit and another end rotatably coupled to the holder.

The body may extend along the rotation axis, the drive unit may be adjacent to one end of the bracket in the longitudinal direction of the body, and the holder may be a portion of the body adjacent to the other end of the bracket in the longitudinal direction of the body.

The body may further include a groove depressed from one side of the body facing the bracket, a first surface defining a boundary of one side of the groove in the rotation direction of the bracket, and a second surface defining a boundary of another side of the groove in the rotation direction of the bracket, and the bracket may overlap the first surface and the second surface in the rotation direction of the bracket.

The drive unit may include a swing motor mounted to the body and providing rotational force, a drive pulley fixed to a rotation shaft of the swing motor, a driven pulley spaced apart from the drive pulley, and a belt engaged with the drive pulley and the driven pulley, wherein the end of the shaft may be fixed to the driven pulley, and a rotation axis of the shaft may be coaxial with the rotation axis of the driven pulley.

The display may further include a pair of displays adjacent to or spaced apart from each other along the body.

The display device for the vehicle may further include a foldable display located between the pair of displays and coupled to the body, and the foldable display may include: a flexible display panel; and a folding module located between the flexible display panel and the body, to which the flexible display panel is coupled, and configured to bend or unfold the flexible display panel.

The sliding assembly may include a lead screw extending in a movement direction of the slider, a motor providing rotational force, and a power transmission member transmitting the rotational force from the motor to the lead screw, wherein the lead screw may penetrate the slider and may be engaged with the slider, and the slider may include a protruding portion protruding from a lateral side of the slider toward the side of the body and fixed to the side of the body.

The display device for the vehicle may further include a frame located between the slider and the body, and the frame may include: a slot formed to be elongated in the movement direction of the slider and through which the protruding portion passes; and a rail extending long in the movement direction of the slider and spaced apart from the slot, the sliding assembly may further include a carriage located between the rail and the body, fixed to the body, and movably coupled to the rail in the longitudinal direction of the rail.

The display device for the vehicle may further include: a base coupled to the other side of the housing; a door pivotably coupled to the base, the door being at least partially located on a movement path of the body and the display; and a pivot assembly pivoting the door with respect to the base, the pivot assembly may include: a pivot motor located on the base and providing rotational force; and a pivot arm connecting the base to the door, the pivot arm including a pivot point fixed to a rotation shaft of the pivot motor, a middle point located on the door so as to be adjacent to a boundary between the base and the door, and a top point spaced apart from the middle point in the width direction of the door.

The display device for the vehicle may further include a flap opposite the base with respect to the door and hinged to the door and a link assembly for hingedly moving the flap relative to the door, the link assembly may further include: a first link arm rotatably coupled to the door; and a second link arm connected to the first link arm, the second link arm including one end rotatably coupled to the first link arm and another end rotatably coupled to the flap, and a rotation axis of the first link arm and a rotation axis of the second link arm may be parallel to the rotation axis of the swing module.

The display device for the vehicle may further include: a top cover covering one surface of the housing, the top cover including a first cover and a second cover connected to each other; and a folding assembly configured to fold or unfold the top cover, the folding assembly may include: a folding motor located on the surface of the housing and providing rotational force, a folding arm which is rotatable in accordance with the rotational force from the folding motor, the folding arm including one end connected to a rotation shaft of the folding motor and another end rotatably coupled to the first cover, and a connecting member coupled to an inner side of the second cover, the connecting member including one end hinged to the first cover and another end hinged to the housing, a rotation axis of the folding arm and a hinge axis of the connecting member may be parallel to the rotation axis of the swing module.

Certain embodiments or other embodiments of the disclosure described above are not mutually exclusive or distinct from each other. Any or all elements of the embodiments of the disclosure described above may be combined with each other in configuration or function.

For example, a configuration "A" described in one embodiment of the disclosure and/or the drawings and a configuration "B" described in another embodiment of the disclosure and/or the drawings may be combined with each other. Namely, although the combination between the configurations is not directly described, the combination is possible except in the case where it is described that the combination is impossible.

The above detailed description is not intended to be construed to limit the disclosure in all aspects and to be considered by way of example. The scope of the disclosure should be determined by reasonable interpretation of the appended claims and all equivalent modifications made without departing from the disclosure should be included in the following claims.

The invention claimed is:

1. A display device for a vehicle comprising:

a housing with an opening at one side;

a sliding assembly located in the housing and including a slider which is movable away from or toward the opening;

a body located in the housing and fixed to the slider;

a display coupled to the body, and which is movable out of the housing through the opening, the display including:

a display panel; and a swing module which is located between the display panel and the body, to which the display panel is coupled, and which is rotatably coupled to the body;

a door assembly which opens or closes the opening of the housing, the door assembly including:

a base coupled to the housing;

a door pivotably coupled to the base; and a pivot assembly pivoting the door about an axis parallel to the rotation axis of the swing module;

a flap hingedly coupled to the door adjacent to an end of the door, the flap being configured to open or close the opening of the housing together with the door; and a link assembly for hingedly moving the flap about an axis parallel to the rotation axis of the swing module, wherein a rotation axis of the swing module extends in a direction intersecting a movement direction of the body.

2. The display device for the vehicle of claim 1, wherein, according to a movement of the body, the display panel is located in the housing or is located outside the housing through the opening of the housing.

3. The display device for the vehicle of claim 2, wherein, when the display panel is located in the housing, the swing module is rotated such that the display panel is parallel to the body, and when the display panel is located outside the housing, the swing module is rotated such that the display panel intersects the body.

4. The display device for the vehicle of claim 1, wherein the swing module comprises:

a plate to which the display panel is coupled;

a bracket protruding from the plate toward the body and rotatably coupled to the body; and a drive unit coupled to the bracket and rotating the bracket about the rotation axis.

5. The display device for the vehicle of claim 4, wherein the swing module further comprises a holder opposite the drive unit with respect to the bracket, and wherein the bracket further comprises a shaft extending along the rotation axis, and including one end connected to the drive unit and another end rotatably coupled to the holder.

6. The display device for the vehicle of claim 5, wherein the body extends along the rotation axis, wherein the drive unit is adjacent to one end of the bracket in a longitudinal direction of the body, and wherein the holder is a portion of the body adjacent to another end of the bracket in the longitudinal direction of the body.

7. The display device for the vehicle of claim 5, wherein the body further comprises:

a groove depressed from one side of the body facing the bracket;

a first surface defining a boundary of one side of the groove in a rotation direction of the bracket; and a second surface defining a boundary of another side of the groove in the rotation direction of the bracket, and wherein the bracket overlaps the first surface and the second surface in the rotation direction of the bracket.

8. The display device for the vehicle of claim 5, wherein the drive unit comprises:

a swing motor mounted to the body and providing rotational force;

a drive pulley fixed to a rotation shaft of the swing motor;

a driven pulley spaced apart from the drive pulley; and a belt engaged with the drive pulley and the driven pulley, wherein the one end of the shaft is fixed to the driven pulley, and wherein a rotation axis of the shaft is coaxial with a rotation axis of the driven pulley.

9. The display device for the vehicle of claim 1, wherein the display further comprises a pair of displays adjacent to or spaced apart from each other along the body.

10. The display device for the vehicle of claim 9, further comprising a foldable display located between the pair of displays and coupled to the body, wherein the foldable display comprises:

a flexible display panel; and a folding module located between the flexible display panel and the body, to which the flexible display panel is coupled, and configured to bend or unfold the flexible display panel.

11. The display device for the vehicle of claim 1, wherein the sliding assembly comprises:

a lead screw extending in a movement direction of the slider;

a motor providing rotational force; and a power transmission member transmitting the rotational force from the motor to the lead screw, wherein the lead screw penetrates the slider and is engaged with the slider, and wherein the slider comprises a protruding portion protruding from a lateral side of the slider toward the one side of the body and fixed to the one side of the body.

12. The display device for the vehicle of claim 11, further comprising a frame located between the slider and the body, wherein the frame comprises:

a slot formed to be elongated in the movement direction of the slider and through which the protruding portion passes; and a rail extending long in the movement direction of the slider and spaced apart from the slot, and wherein the sliding assembly further comprises a carriage located between the rail and the body, fixed to the body, and movably coupled to the rail in a longitudinal direction of the rail.

13. The display device for the vehicle of claim 1, wherein the door is at least partially located on a movement path of the body and the display; and wherein the pivot assembly comprises:

a pivot motor located on the base and providing rotational force; and a pivot arm connecting the base to the door, the pivot arm including a pivot point fixed to a rotation shaft of the pivot motor, a middle point located on the door so as to be adjacent to a boundary between the base and the door, and a top point spaced apart from the middle point in a width direction of the door.

14. The display device for the vehicle of claim 13, wherein the link assembly further comprises:

a first link arm rotatably coupled to the door; and a second link arm connected to the first link arm, the second link arm including one end rotatably coupled to the first link arm and another end rotatably coupled to the flap, and wherein a rotation axis of the first link arm and a rotation axis of the second link arm are parallel to the rotation axis of the swing module.

15. The display device for the vehicle of claim 1, further comprising:

a top cover covering one surface of the housing, the top cover including a first cover and a second cover connected to each other; and a folding assembly configured to fold or unfold the top cover, wherein the folding assembly comprises:

a folding motor located on the one surface of the housing and providing rotational force;

a folding arm which is rotatable in accordance with the rotational force from the folding motor, the folding arm including one end connected to a rotation shaft of the folding motor and another end rotatably coupled to the first cover; and a connecting member coupled to an inner side of the second cover, the connecting member including one end hinged to the first cover and another end hinged to the housing, and wherein a rotation axis of the folding arm and a hinge axis of the connecting member are parallel to the rotation axis of the swing module.

* * * * *